United States Patent [19]
Adams

[11] Patent Number: 5,638,010
[45] Date of Patent: Jun. 10, 1997

[54] DIGITALLY CONTROLLED OSCILLATOR FOR A PHASE-LOCKED LOOP PROVIDING A RESIDUE SIGNAL FOR USE IN CONTINUOUSLY VARIABLE INTERPOLATION AND DECIMATION FILTERS

[75] Inventor: Robert W. Adams, Acton, Mass.

[73] Assignee: Analog Devices, Inc., Norwood, Mass.

[21] Appl. No.: 473,082

[22] Filed: Jun. 7, 1995

[51] Int. Cl.⁶ .................. H03K 19/00; H03L 7/099
[52] U.S. Cl. .................. 327/105; 327/107; 327/295
[58] Field of Search .................. 327/105–107, 327/117, 113, 291, 295, 296; 331/1 A

[56] References Cited

U.S. PATENT DOCUMENTS

| | | | |
|---|---|---|---|
| 3,632,905 | 1/1972 | Thomas et al. | 179/170.2 |
| 3,829,670 | 8/1974 | Kebabian | 235/152 |
| 3,882,403 | 5/1975 | Gerken | 331/1 A |
| 3,928,755 | 12/1975 | Bellanger et al. | 235/152 |
| 3,988,607 | 10/1976 | Eggermont et al. | 235/156 |
| 3,997,773 | 12/1976 | Van Essen et al. | 235/156 |
| 4,020,332 | 4/1977 | Crochiere et al. | 235/152 |
| 4,131,764 | 12/1978 | Claasen et al. | 179/15 FS |
| 4,179,670 | 12/1979 | Kingsbury | 331/10 |
| 4,224,585 | 9/1980 | Tanaka | 333/165 |
| 4,233,500 | 11/1980 | Cordill | 235/310 |
| 4,270,026 | 5/1981 | Shenoi et al. | 179/15.55 |
| 4,281,318 | 7/1981 | Candy et al. | 341/61 |
| 4,344,149 | 8/1982 | van de Meeberg et al. | 364/724 |
| 4,374,426 | 2/1983 | Burlage et al. | 364/724 |
| 4,386,430 | 5/1983 | Treiber | 375/14 |
| 4,460,890 | 7/1984 | Busby | 340/347 |
| 4,472,785 | 9/1984 | Kasuga | 364/718 |
| 4,482,975 | 11/1984 | King et al. | 364/608 |
| 4,494,073 | 1/1985 | Sorgi | 327/105 |
| 4,527,020 | 7/1985 | Ito | 179/170.2 |
| 4,528,639 | 7/1985 | Edwards | 364/723 |
| 4,564,918 | 1/1986 | McNally et al. | 364/569 |

(List continued on next page.)

FOREIGN PATENT DOCUMENTS

| | | |
|---|---|---|
| 0 052 847 | 2/1982 | European Pat. Off. . |
| 0 084 592 | 3/1983 | European Pat. Off. . |
| 0 227 172 | 1/1987 | European Pat. Off. ....... H03H 17/06 |
| A20299724 | 1/1989 | European Pat. Off. . |
| 0323200 | 7/1989 | European Pat. Off. . |
| 0441155 | 8/1991 | European Pat. Off. . |
| 404082407 | 3/1992 | Japan .................. 327/105 |
| 1 186 751 | 7/1985 | United Kingdom ............ 328/0.3 |
| WO96/03808 | 2/1996 | WIPO . |

OTHER PUBLICATIONS

V. Reinhardt et al., A Short Survey of Frequency Synthesizer Techniques, IEEE, 1986, pp. 355–365.

K.M. Wong et al., "Commutativity and Application of Digital Interpolation Filters and Modulators," IEEE Transactions on Communications, vol. COM–28, No. 2, pp. 244–249, Feb. 1980.

(List continued on next page.)

*Primary Examiner*—Terry Cunningham
*Assistant Examiner*—T. Lam
*Attorney, Agent, or Firm*—Wolf, Greenfield & Sacks, P.C.

[57] ABSTRACT

A digitally controlled oscillator in a digital phase-locked loop provides an additional output signal which indicates the time difference between clock pulses output from the digitally controlled oscillator and clock pulses of an ideal clock signal of the same average frequency. This additional signal is called a residue signal. This residue signal may then be used to extrapolate or interpolate outputs of continuously variable interpolation or decimation filters using the output clock signal of the digital phase-locked loop generated according to the digitally controlled oscillator. Because the residue signal may be used in interpolation or decimation filters, it is also applicable to analog-to-digital converters, digital-to-analog converters and sample rate converters which use such filters. The digital phase-locked loop circuit is simpler than previous circuits because a conventional overflowing accumulator may be used, which is a first order system, rather than a higher order multi-bit noise shaper. Additionally, a simpler interpolation or decimation filter may be used.

31 Claims, 17 Drawing Sheets

U.S. PATENT DOCUMENTS

| | | | |
|---|---|---|---|
| 4,577,163 | 3/1986 | Culp | 331/1 A |
| 4,584,659 | 4/1986 | Stikvoort | 364/724 |
| 4,602,285 | 7/1986 | Beaulier et al. | 358/160 |
| 4,604,720 | 8/1986 | Stikvoort | 364/724 |
| 4,636,734 | 1/1987 | Genrich | 327/106 |
| 4,748,578 | 5/1988 | Lagadec et al. | 364/724 |
| 4,780,892 | 10/1988 | Lagadec | 375/118 |
| 4,797,845 | 1/1989 | Stikvoort | 364/724.1 |
| 4,802,109 | 1/1989 | Machida | 364/723 |
| 4,825,398 | 4/1989 | Koch et al. | 364/724.1 |
| 4,837,619 | 6/1989 | Tsinberg | 358/140 |
| 4,866,647 | 9/1989 | Farrow | 364/724.1 |
| 4,951,004 | 8/1990 | Sheffer | 327/105 |
| 4,953,117 | 8/1990 | Lagadec | 364/724.1 |
| 4,954,824 | 9/1990 | Yamada et al. | 341/61 |
| 4,959,616 | 9/1990 | Matsumoto | 327/106 |
| 4,987,373 | 1/1991 | Soo | 328/155 |
| 4,990,911 | 2/1991 | Fujita et al. | 341/123 |
| 5,014,231 | 5/1991 | Reinhardt et al. | 327/107 |
| 5,023,825 | 6/1991 | Luthra et al. | 364/724.1 |
| 5,028,887 | 7/1991 | Gilmore | 327/107 |
| 5,055,801 | 10/1991 | Koga et al. | 327/105 |
| 5,075,679 | 12/1991 | Gazsi | 341/143 |
| 5,084,681 | 1/1992 | Kovalick et al. | 327/106 |
| 5,111,417 | 5/1992 | Belloc et al. | 364/724.1 |
| 5,119,093 | 6/1992 | Vogt et al. | 341/123 |
| 5,121,065 | 6/1992 | Wagner | 324/607 |
| 5,157,395 | 10/1992 | Del Signore et al. | 341/143 |
| 5,182,633 | 1/1993 | Antonio et al. | 358/11 |
| 5,202,642 | 4/1993 | Dixon | 327/105 |
| 5,204,827 | 4/1993 | Fujita et al. | 364/724.1 |
| 5,227,787 | 7/1993 | Kurashina | 341/61 |
| 5,247,469 | 9/1993 | McCune, Jr. | 364/721 |
| 5,272,655 | 12/1993 | Roza | 364/724.1 |
| 5,313,205 | 5/1994 | Wilson | 341/144 |
| 5,321,642 | 6/1994 | Goldberg | 364/721 |
| 5,353,026 | 10/1994 | Wilson | 341/143 |
| 5,371,765 | 12/1994 | Guilford | 327/107 |
| 5,375,065 | 12/1994 | Owen | 327/107 |
| 5,399,984 | 3/1995 | Frank | 327/107 |
| 5,467,294 | 11/1995 | Hu et al. | 327/106 |

OTHER PUBLICATIONS

R. Lagadec et al., "A Universal, Digital Sampling Frequency Converter for Digital Audio," Proc. ICASSP 1981, pp. 595–598.

R. Crochiere et al., "Further Considerations in the Design of Decimators and Interpolators," IEEE Transactions on Acoustics, Speech and Signal Processing, vol. ASSP–24, No. 4, pp. 296–311, Aug. 1976.

L. Rabiner et al., "Theory and Application of Digital Signal Processing," Prentice–Hall, Inc., Englewood Cliffs, N.J., 1975, pp. 541–544.

L. Rabiner et al., "Terminology in Digital Signal Processing," IEEE Transactions on Audio and Electro–acoustics, vol. AU–20, No. 5, pp. 322–337, Dec. 1972.

R. Schafer et al., "A Digital Processing Approach to Interpolation," Proceedings of the IEEE, vol. 61, No. 6, pp. 692–702, Jun. 1973.

R. Lagadec, "Digital Sampling Frequency Conversion," AES Premier Conference on Digital Audio, Proceedings, (Rye, N.Y., 1982), pp. 90–96.

J. Wilkinson, "Communications in the Digital Audio Studio," presented at the 7th International Conference: Audio in Digital times, May 1989.

T. Shelton, "Synchronization of Digital Audio," Presented at the AES 7th International Conference: Audio in Digital Times, May, 1989.

D. Goodman et al., "Nine Digital Filters for Decimation and Interpolation," IEEE Trans. Acout., Speech and Signal Proc., vol. ASSP–25 pp. 121–126, Apr. 1977.

R. Crochiere et al., "Interpolation and Decimation of Digital Signals—A Tutorial Review," Proc. IEEE, vol. 69, pp. 300–331, Mar. 1981.

J. O. Smith and P. Gossett, "A Flexible Sampling Rate–Conversion Method," ICASSP 1984, pp. 19.4.1–19.4.4.

Tor A. Ramstad, "Digital Methods for Conversion Between Arbitary Sampling Frequencies," IEEE Transactions on Acoustics, Speech and Signal Processing, vol. ASSP–32, No. 3, Jun. 1984, pp. 577–591.

J. Jansen et al., "A New Principle/IC for Audio Sampling Rate Conversion," presented at the 96th Convention, Feb. 26, 1994 –Mar. 1, 1994.

Richard J. Higgins, "Digital Signal Processing in VLSI," Prentice Hall, Englewood Cliffs, NJ 07632, 1990, pp. 29–31.

Douglas F. Elliott et al., "Fast Transforms, Algorithms, Analyses, Applications," 1982, Academic Press. p. 13.

Paul J. Hurst et al., "A Programmable Clock Generator Using Noise Shaping and Its Application in a Switched–Capacitor Filter, Solid State Circuits Research Laboratory, Dept. of Electrical and Computer Engineering", University of California, Davis (two pages).

H. Trazeguet, "Les CAN Delta–Sigma Deviennent Programmables," Electronique, No. 24, Jan. 1993, Paris, France, pp. 42–44.

Patent Abstracts of Japan, vol. 003, No. 018 (E–091), Feb. 16, 1979 & JP–A–53147409 (Fujitsu Ltd.), Dec. 22, 1978.

"Serial–Port 16–Bit SoundComm Codec AD1843," Analog Devices 1995 DSP/MSP Products Reference Manual, Jan. 1995, pp. 3–5–3–6.

"Highly Integrated Stereo Codec ICs Drive Multimedia, AD1843 combines fax/modem and games compatible audio capabilities, includes sample–rate conversion, AD1845 exceeds MPC Level–2 requirements," Analog Dialogue, vol. 29, No. 1, 1995, Jan. 1995, D. Babicz, M. Wood and A. Haun.

"SOUNDCOMM CODEC AD1843, General Product Description," Analog Devices' interoffice disclosure materials of new product line, Printed Oct. 11, 1994.

"SamplePort Stereo Asynchronous Sample Rate Converters AD1890/AD1891," Analog Devices 1995 DSP/MSP Products Reference Manual, Jan. 1995, pp. 4–57–4–66.

"Asynchronous Sample–rate Converters, AD1890/AD1891 SamplePorts solve interfacing and compatibility problems in digitalaudio equipment," Bob Adams, Analog Dialogue, vol. 28, No. 1, 1994, pp. 9–11.

DIGITALLY CONTROLLED OSCILLATOR FOR A PHASE-LOCKED LOOP PROVIDING A RESIDUE SIGNAL FOR USE IN CONTINUOUSLY VARIABLE INTERPOLATION AND DECIMATION FILTERS

FIELD OF THE INVENTION

This invention relates to digitally controlled oscillators, particularly for use in a digital phase-locked loop. Digital phase-locked loops are used in continuously variable digital interpolation and decimation filters which may be found in analog-to-digital and digital-to-analog converters. Additionally, digital phase-locked loops may be used in sample rate converters using such digital, continuously variable interpolation and/or decimation filters.

BACKGROUND OF THE INVENTION

Oversampled sigma-delta digital-to-analog (D/A) and analog-to-digital (A/D) converters use interpolation and decimation filters, respectively. Such filters typically require a high frequency clock signal that is a binary multiple of either an input sample rate or an output sample rate. That is, the interpolation filter in the D/A converter requires a high frequency clock signal that is a simple binary multiple of the input sample rate, whereas the A/D converter, using a decimation filter, usually requires a high frequency clock signal that is a simple binary multiple of the output sample rate.

FIG. 1 shows a conventional sigma-delta D/A converter 30. Digital input data 32, a frame clock 34, and a high-speed master clock 36 are inputs to the converter. The high speed master clock is a simple binary multiple of the frame clock, and is typically 64, 128, or 256 times higher than the input rate. An interpolation filter 38 takes the digital input data 32 in at the frame clock rate, i.e., the input rate (Fs_in), and produces an interpolated output 40 at the rate of the high-speed master clock. The clocks to drive the interpolation filter and other parts of the D/A converter 30 are provided by a clock generator 50 which receives the frame clock and the master clock and generally divides them appropriately. The interpolated output 40 is then fed to a noise shaping circuit 42 that provides an output 44 with a reduced number of bits, to a small number often as low as 1 (a single bit). A D/A converter 46 provides an analog output 48 according to the output 44 of the noise shaper 42.

In systems where a variety of input sample rates must be accommodated, generating the required high frequency master clock that is, for example, 64 times the input sample rate can be difficult. Frequently, an analog phase-locked loop (PLL) is required to generate this clock. Thus, digital integrated circuits designed to perform such D/A conversion have an input for receiving the high frequency signal which is presumed to be phase-locked to the input data, and it is assumed that the user of such a circuit will use an analog PLL to generate the master clock. Thus, an asynchronous master clock cannot be used.

Digital PLLs are generally not used because the use of a digital PLL to generate the high frequency master clock based on the input clock (Fs_in) normally leads to serious performance degradation due to the fact that the clock signal the digital PLL produces must switch on a system master clock edge which is asynchronous relative to the input clock. Since the system master clock rate has no relationship with the input sample rate, there will be a variable number of system master clock pulses for each 64*Fs_in clock pulse. For example, with a system master clock frequency of 7 MHZ and a high frequency master clock frequency of 64*FS_in (approximately 3 MHZ), there will be on average 7/3 system master clock pulses for each cycle of the 3 MHZ signal. Since the 64*FS_in clock signal is generated by a digital PLL that is clocked with the system master clock, some cycles of the 64*FS_in clock signal will last for two system master clock cycles, and some will last for three system master clock cycles, in such a way as to make the average equal to 7/3. This translates to a large amount of jitter on the output of the digital PLL, which would cause distortion and noise to occur in the resulting analog signal at the output of the D/A converter 46.

It is preferable to use a digital PLL to provide a single digital integrated circuit which accommodates a number of input sample rates but which eliminates the requirement of an analog PLL and allows a user to provide only an asynchronous master clock instead of a master clock phase-locked to the input rate. Such a system has been provided by Analog Devices, Inc., in a product called the AD1843. While this product has distinct advantages, a complex noise shaping scheme is used to overcome the problems caused by using a digital PLL.

SUMMARY OF THE INVENTION

In order to overcome errors generated due to the time quantization error of the digital phase-locked loop, the digitally controlled oscillator of the digital phase-locked loop provides an additional output signal which indicates the amount of error found in the time quantization, herein called a residue signal. This residue signal is a measure of the time difference between the arrival of an imaginary ideal analog clock phase-locked to the input clock and the clock of a digital phase-locked loop, locked to the input clock. This residue signal may be used to extrapolate or interpolate outputs of interpolation or decimation filters using the output clock signal of the digital phase-locked loop. Because the residue signal may be used in interpolation or decimation filters, it is applicable to analog-to-digital converters, digital-to-analog converters and sample rate converters. The digital phase-locked loop circuit is simpler than previous methods because a conventional overflowing accumulator may be used, which a first order system, rather than a higher order multi-bit noise shaper. Additionally, a simpler interpolation or decimation filter may be used.

Accordingly, one aspect of the invention is a digitally controlled oscillator for use in a digital phase-locked loop. The oscillator includes a clock signal generator having a first input for receiving a frequency control signal, a second input receiving a master clock signal and an output providing a clock signal with clock pulses occurring at an average frequency proportional to the frequency control signal. The oscillator also includes a circuit which measures a time period between an ideal arrival time of a clock pulse of an ideal clock signal and an arrival time of a clock pulse in the output clock signal from the clock signal generator.

The digitally controlled oscillator uses a modulo accumulator to provide a periodically overflowing ramp signal which is sampled by a latch according to the master clock. The accumulator increments according to the frequency control signal at the rate of the master clock. When the accumulator wraps, the output of the accumulator indicates the time measure and thus provides the residue signal. The lower bits of this output can be sampled prior to the next clock pulse of the master clock to provide a latched residue signal.

In a particular embodiment, the digitally controlled oscillator has an accumulator implemented as a combination of an adder and a latch. The adder has one input connected to the frequency control signal and a second input connected to the output of the latch. The latch latches the output of the adder on every pulse of the master clock. The most significant bit of the output of the latch is used to generate the phase-locked clock signal. The lower bits of the output of the latch are then latched by a second latch controlled by a delayed master clock signal, ANDed by an AND gate with the phase-locked clock signal. The output of this second latch provides a latched residue signal. A normalized residue signal can be obtained by dividing the latched residue signal with a latched frequency control signal.

Another aspect of this invention is a digital phase-locked loop for generating a output clock signal having an average frequency substantially higher than an input clock signal, using such a digitally controlled oscillator. A phase detector receives the input clock signal and the output of a clock divider that receives the phase-locked clock signal. The phase detector produces an output which is a measure of a difference in phase of these two clock signals. A loop filter filters the output of the phase detector to provide the frequency control signal. The frequency control signal is provided to the digitally controlled oscillator which in turn provides the phase-locked clock signal.

Another aspect of this invention is a digital interpolation filter for interpolating input data received at a rate defined by an input clock signal, using such a digital phase-locked loop. The interpolation filter has a first input for receiving the phase-locked clock signal and a second input for receiving input data. It provides an output value, by interpolating the input data, at time intervals according to the phase-locked clock signal. A correction circuit receives the interpolated output from a first time value and a second interpolated output from a second time value and the latched residue signal. The correction circuit performs a corrective function on the interpolated data according to the residue signal. In one embodiment, the correction is a form of extrapolation and the corrected output is the sum of the second output and the product of the residue and the difference between the second output and the first output.

Another aspect of the present invention is a digital-to-analog converter using such a digital interpolation filter. The output of the filter, provided at the phase-locked clock signal rate, is fed to a noise shaper clocked by the master clock which provides a noise-shaped signal. A D/A converter clocked by the master clock receives the output of the noise-shaper and outputs a corresponding analog signal.

Another aspect of the present invention is a decimation filter using the phase-locked loop which provides a latched residue signal. This filter receives input data at a rate related to the phase-locked clock signal. This data is received from a correction circuit which receives data at a uniform rate and generates a corrected output of correct values corresponding to actual arrivals of clock pulses of the phase-locked clock signal. In one embodiment, the correction circuit performs a form of backward interpolation according to the latched residue signal and two input values. Preferably, the decimation filter uses a normalized latched residue signal. The correction circuit may use latches to provide a delay to allow for time for a divider circuit to compute the latched residue signal.

Another aspect of the invention is a sample rate converter using the interpolation filter with correction circuit described above to convert a sequence of input samples having an input sampling rate to a sequence of output samples having an output sampling rate. When the master clock rate is a simple multiple of the output sampling rate, a simple decimation filter may be provided to read values output by the corrected interpolation filter. The data is read by the decimation filter at the master clock rate and changes at the phase-locked clock signal rate. When both the input and output sampling rates are asynchronous with the master clock, each of the interpolation filters and decimation filters have a phase-locked loop (PLL). The PLL for the interpolation filter is locked to the input sampling rate and the PLL for the decimation filter is locked to the output sampling rate. Each PLL provides its own latched residue signal and its own corresponding correction circuit as described above.

Another aspect of the invention is a process for generating the latched residue signal described above. This process involves the step of generating a clock signal phase-locked to the input data rate in which clock pulses are generated synchronously with pulses of a master clock signal, and the step of measuring a time difference between an arrival of an ideal clock pulse and an arrival of an actual clock pulse of the phase-locked clock signal. In particular, this measurement is performed by generating a periodically overflowing ramp signal using a modulo accumulator which receives and accumulates a frequency control signal and sampling the output of the accumulator immediately after an overflow occurs and before a master clock pulse occurs.

Another aspect of this invention is a process of interpolating an input signal using such a latched residue signal and a digital phase-locked loop. The input data is oversampled and output at a rate defined by the phase-locked clock signal. The output is corrected according to the latched residue signal. Preferably, the correction is a form of extrapolation using at least two subsequent outputs and the latched residue signal.

Another aspect of this invention is a process for decimating an input signal using such a phase-locked loop clock signal and a latched residue signal. The input signal is corrected using the latched residue signal such that the values of the signal correspond to sample times of the phase-locked clock signal. Preferably, correction is performed using at least two sequential samples and the latched residue signal and a form of backwards interpolation. The corrected signal is then decimated using a filter which reads the corrected signal at the rate of the phase-locked clock signal.

Another aspect of this invention is a process for converting between input and output sampling rates of input and output sequences of samples. The process involves interpolating the input sequence using the interpolation process described above. If the output sampling rate is asynchronous with the master clock driving the phase-locked loop used by the interpolation filter, a decimation filter as described above receives its input from the corrected output of the interpolation filter.

DETAILED DESCRIPTION

The present invention will be more completely understood through the following detailed description which should be read in conjunction with the attached drawing of several figures in which similar reference numbers indicate similar structures.

Figure 2:
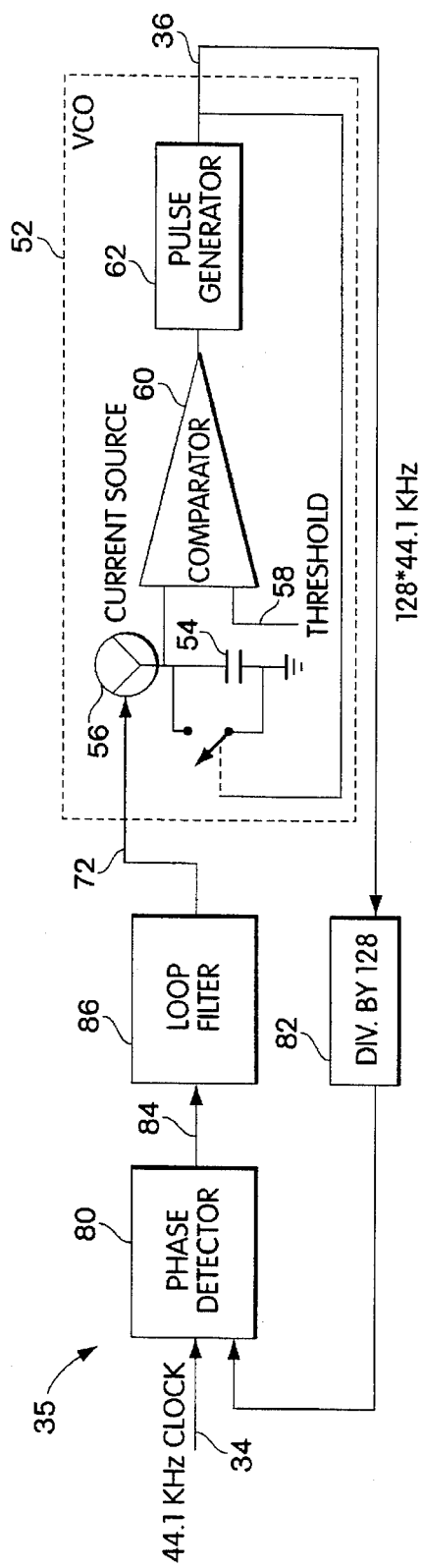
FIG. 2 is a block diagram of an analog phase-locked loop.
Figure 3:
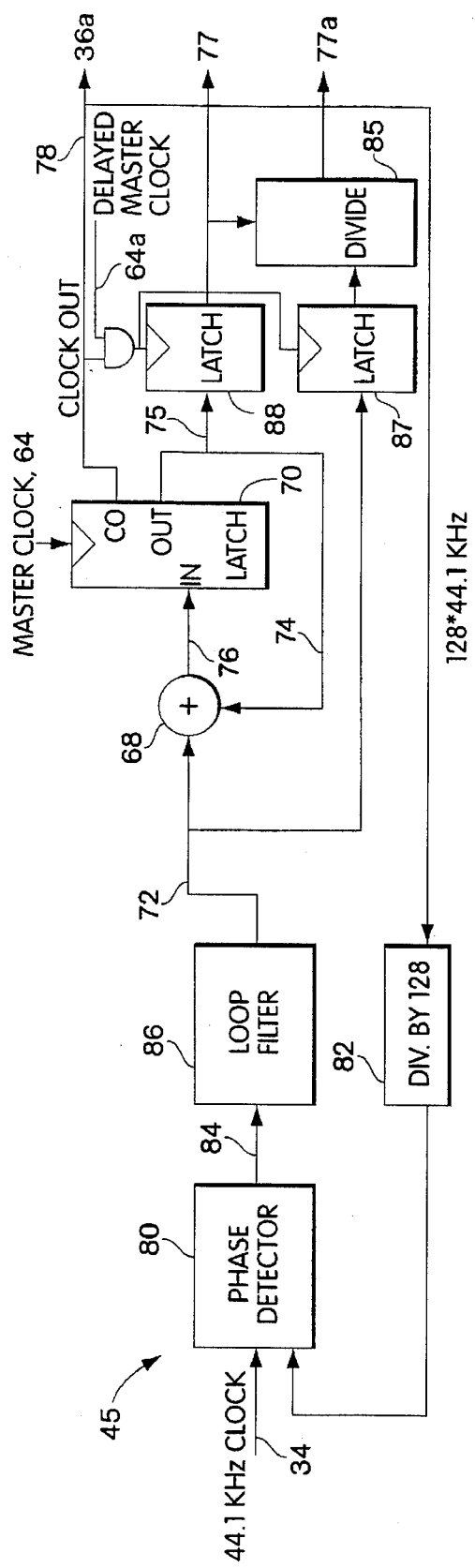
FIG. 3 is a block diagram of a digital phase-locked loop in accordance with the invention.

FIG. 2 shows a typical analog PLL 35 and FIG. 3 shows an embodiment of a digital PLL 45 in accordance with the invention. The voltage-controlled oscillator 52 (VCO) used in the analog PLL works by charging a capacitor 54 through a current source 56, and when the voltage reaches some threshold 58, as determined by a comparator 60, a clock pulse is produced by a pulse generator 62 and the capacitor is discharged. The frequency of this oscillator is controlled by the value of the current source, which is controlled by a frequency control signal 72. The frequency control signal is based on a phase detector 80 which receives the input signal 34 and the output clock 78 of the oscillator divided using divider 82 by a factor, e.g., 128, by which the phase-locked loop is designed to multiply the input rate. The output 84 of the phase detector is applied to a loop filter 86 which then provides the frequency control signal 72.

In FIG. 3, the digital PLL 45 has a digitally-controlled oscillator (DCO) 66, which is driven by a high frequency master clock signal 64. In the digital PLL, for the phase detector, if the input clock signal is asynchronous relative to the master clock, one or more synchronizing latches are normally used to prevent metastability problems. The digitally controlled oscillator (DCO) generally includes a clock signal generator which receives the frequency control signal 72 and outputs a clock signal with clock pulses occurring on edges of the master clock signal and at an average frequency proportional to the frequency control signal. The clock signal generator may be implemented using a modulo accumulator. In the embodiment shown in FIG. 3, the modulo accumulator is comprised of an adder 68 and a latch 70. The adder receives a frequency control signal 72 (Nbits) which is added to the lower bits of the output 74 of the latch 70. The sum 76 output from the adder, N+1 bits, is then latched into latch 70 on the master clock edge. On every other edge, either rising or falling, of the master clock signal the frequency control signal 72 is added to the modulo accumulator, causing the value of the modulo accumulator to 'ramp' in a manner similar to the capacitor voltage in the analog VCO. When the value in the modulo accumulator reaches some threshold, usually a trivial binary number, the modulo accumulator wraps. A clock pulse is produced every time the modulo accumulator wraps. In practice this pulse is derived from the overflow bit of the accumulator. For example, if the frequency control signal 72 is a 16-bit word and the feedback from the accumulator latch is also 16 bits, then the sum of these two signals is a 17-bit word. This 17-bit signal is latched, and the lower 16 bits are fed back to the adder. The 17th bit is used as a wrap detector, and whenever this bit is set to a "1" an output pulse is produced on the "clock out" line 78.

The "residue" 75 is the value of the modulo accumulator, e.g., latch 70, immediately after a wrap has occurred and before the next master clock pulse occurs. The residue signal provides a measure of the time between an arrival of clock pulse of an ideal analog PLL clock signal, defined as a signal with uniform period at the average frequency of the actual digital PLL clock signal, and the arrival of an actual DCO clock pulse. This residue 75 is latched by latch 88 upon an edge of the phase-locked clock signal 78 and a delayed master clock edge 64a (illustrated by AND gate 87), and is held until the next overflow occurs. The output of latch 88 is the latched residue signal 77. Optionally, another latch 87 is loaded at the same time as latch 88 to capture the frequency control signal 72. The ratio of the latched residue signal 77 to the latched frequency control signal is determined by divider 85, which provides a latch normalized residue signal 77a which is described in more detail below.

Figure 4:
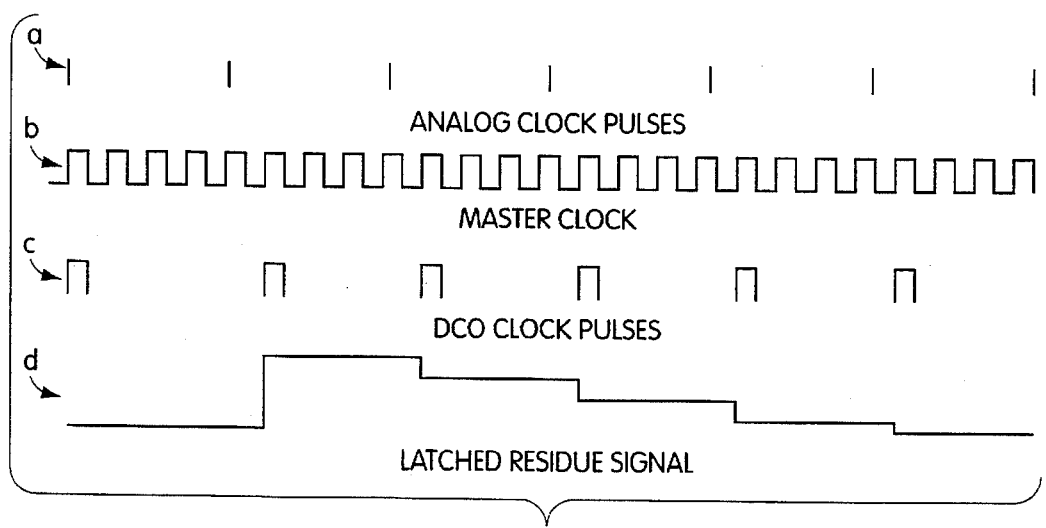
FIG. 4 is a timing diagram illustrating the output of a digitally controlled oscillator in accordance with the present invention as compared to a master clock and the output of an analog phase-locked loop.

FIG. 4 shows an example of how the residue signal may change from one asynchronous master clock pulse to the next. Ideal analog clock pulses are illustrated schematically on line A. The high frequency master clock signal 64 is illustrated at line B which is illustrated as being asynchronous with the ideal analog clock pulses of an analog phase lock loop. The digitally controlled oscillator clock signal 78 shown in line C are shown schematically as occurring asynchronously with the ideal analog clock pulses, but in synchronization with the master clock. The latched residue signal 77 shown in line D is shown as decreasing in this example with each of the clock pulses of the digitally controlled oscillator. Note that when the DCO signal is very late compared with the VCO signal, a large residue is generated.

The "average" frequency (PLL FREQ) of the digital PLL is:

PLL FREQ=mclk_freq*(Freq_control/Wrap_threshold), where "wrap_threshold" is the threshold value at which the accumulator wraps, normally a trivial $2^N$ binary number (N is the number of bits in the DCO accumulator register), "freq_control" is the frequency control input value (e.g., 72 in FIG. 2), and "mclk_freq" is the frequency of the asynchronous master clock.

Suppose both an analog VCO and a digital DCO produce clock signals with exactly the same long-term frequency. If the phases are also synchronized, the digital signal at the accumulator output 75 represents samples of the continuous-time analog ramp signal on the capacitor of the analog VCO, as shown at 90 in FIG. 5.

Figure 5:
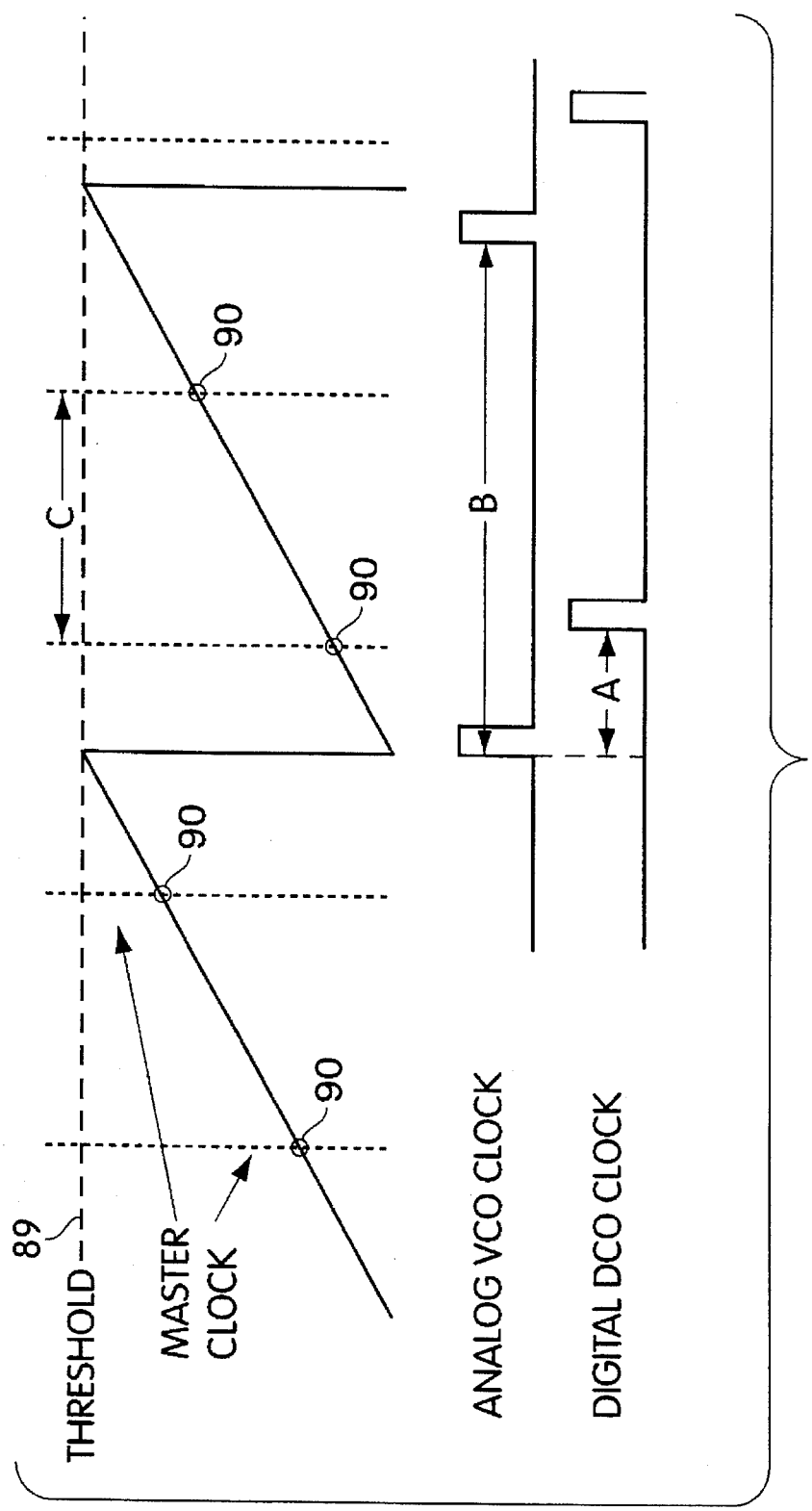
FIG. 5 is a timing diagram illustrating the relationship of an accumulator in a digitally controlled oscillator to analog and digital phase-locked loop signals.

If the clock signals produced by the synchronized DCO and VCO are compared, the digital clock signal is always "late" compared to the analog clock signal, due to the fact that the DCO is clocked by master clock and must therefore wait until the next edge of the master clock before it can detect that a wrap has occurred when the output 75 of the modulo accumulator reaches threshold 89. The degree of this lateness can be found by examining the residue signal 77 after the wrap has occurred. For example, a large residue signal means that the clock is very late compared with the ideal analog VCO clock. Likewise, a small residue signal means that the clock is only slightly late compared to the ideal analog VCO clock. This time difference between DCO clock and ideal analog VCO clock is quantifiable, and is represented by the following formula:

Residue=A/B, where "A" is the time difference between corresponding pulses in the digital and analog clocks, and "B" is the period of the analog clock as shown in FIG. 5.

In other words, the residue signal represents the lateness of the digital clock measured as a fraction of the period of the ideal analog VCO clock. This relationship is used to correct the output of the digital interpolator or decimator that uses the digital PLL as described below.

Another residue signal may also be derived from the basic DCO circuit. By taking the ratio of the residue signal to the frequency control signal, a "normalized" residue signal is provided with a value given by:

Normalized_residue=A/C, where "C" is the period of the master clock, and "A" is the phase difference between the DCO clock and the ideal analog VCO clock as represented in FIG. 5. In other words, the normalized residue is the time difference between digital and analog clocks expressed as a fraction of a master clock period. The normalized residue 77a is provided by divider 85.

Figure 1:
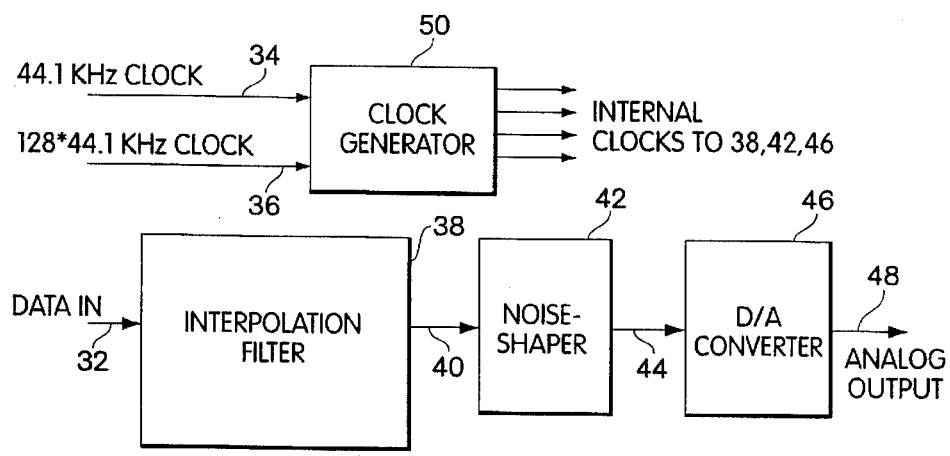
FIG. 1 is a block diagram of a conventional oversampled sigma-delta digital-to-analog converter.
Figure 6:
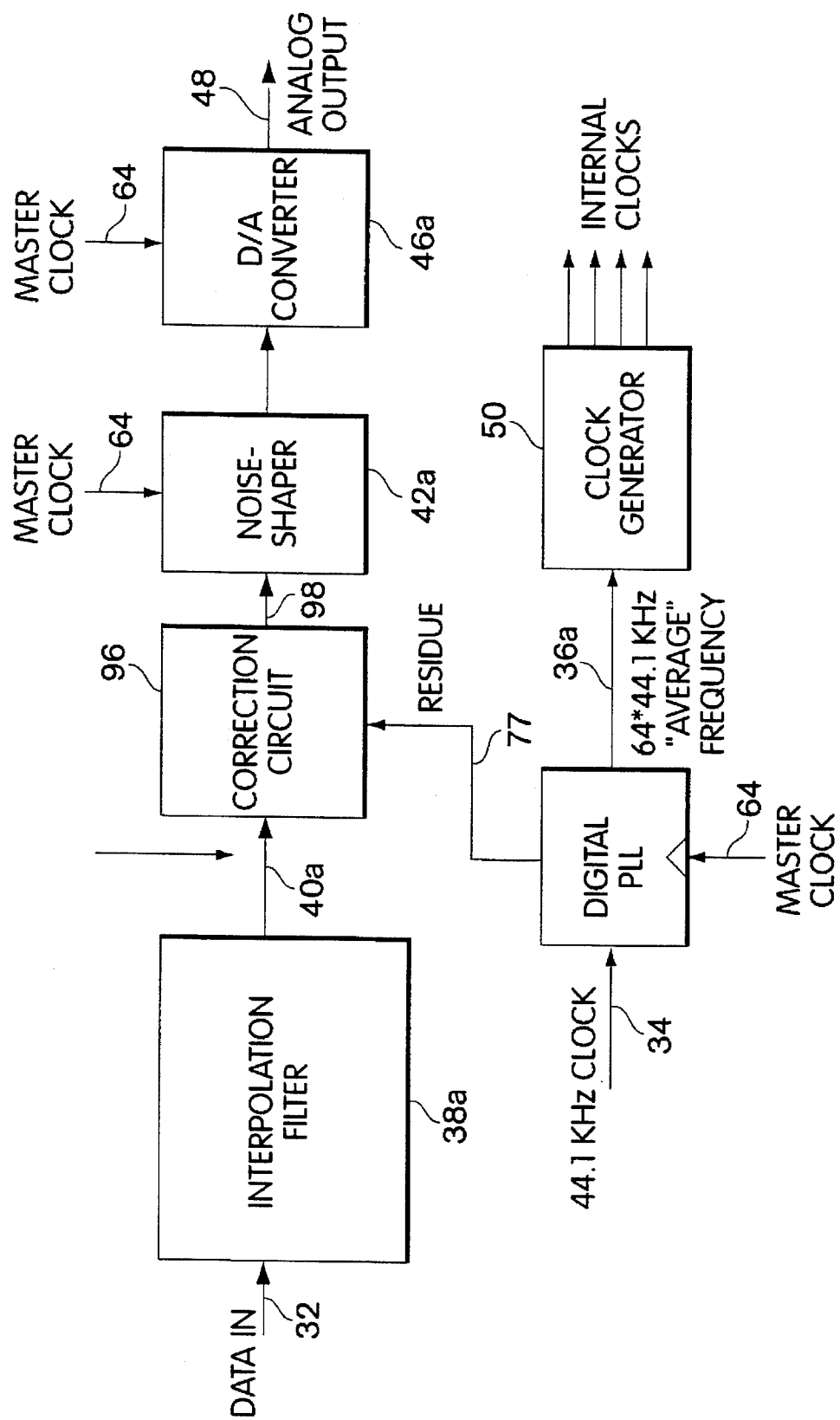
FIG. 6 is a block diagram illustrating a digital-to-analog converter in accordance with the invention.

FIG. 6 shows a D/A converter 92 that uses a digital PLL 45 to generate the required high-frequency clock signal, labeled 36a, which is a multiple of the input clock rate. This D/A converter 92 is similar to that of FIG. 1, but the components are operating at the asynchronous master clock rate. A high-frequency asynchronous, master clock 64 is still required for the operation of the circuit, but it does not need to be related in any way to the frame clock (input sample rate). Such a converter thus may be embodied in a digital integrated circuit which has an input that receives an asynchronous system master clock used to drive the digital PLL. This allows a circuit designed to use such a converter to provide a fixed asynchronous high-frequency clock and eliminates the need for an analog PLL, thus simplifying circuit design for a number of applications. The D/A converter 92 of FIG. 6 includes a "correction circuit" 96 inserted between the output 40a of the interpolation filter 38a and the input 98 of the noise-shaper 42a. This correction circuit uses the "residue" signal 77 from the digital PLL 45 to alter the value of the interpolation filter output in such a way as to make the value correspond to the actual time at which the data will be produced at the DAC output. By making this correction, the distortion introduced by using the jittered clock 36a from the digital PLL is drastically reduced.

Figure 7:
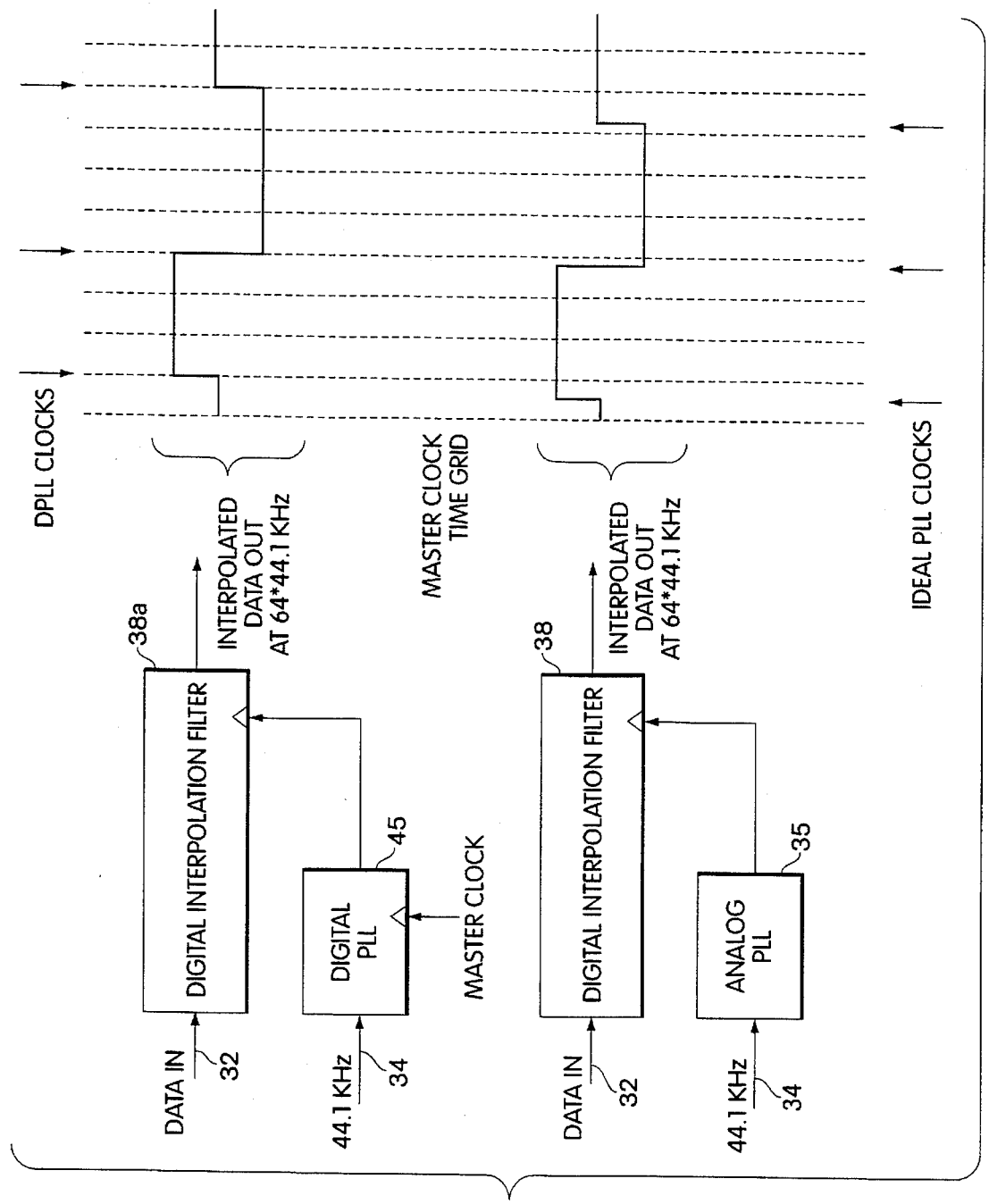
FIG. 7 illustrates a relationship between an output of a digital interpolation filter driven by a digital phase-locked loop to the output of a digital interpolation filter driven by an analog phase-locked loop.

To explain the basis of correction, FIG. 7 compares two digital interpolators, one driven from the output of an analog VCO, and one driven from the output of a DCO. The master clock is typically higher than the average DCO frequency by some factor ranging from 2 to 16 (although there is no upper limit). For example, in an audio system, the average DCO frequency may be 3 MHZ, and the master clock may be around 12 MHZ. This means that on average, a DCO output pulse occurs every 4 master clock pulses. The actual number varies from one cycle to the next in such a way that the long-term average rate is exact.

Since the interpolation filters shown in FIG. 7 are both digital and receive the same inputs, they produce the same numbers at their outputs, but the results are available at different times. Since the digital PLL produces clock pulses that are constrained to occur at times corresponding to the edges of a master clock signal, the output of the digital PLL-driven interpolator can be considered to be a discrete-time signal at the master clock rate. Therefore the output signal is analyzed using output data that is captured at the full rate, even though the output may change on average only once every four master clock cycles.

The fact that the system driven by the digital PLL produces the right answers at the wrong time produces distortion in the output signal. For example, computer simulations have shown that with an oversampling factor of 64 and a master clock that is four times higher in frequency than the interpolator output rate, the worst-case distortion is about 80 dB.

Figure 8:
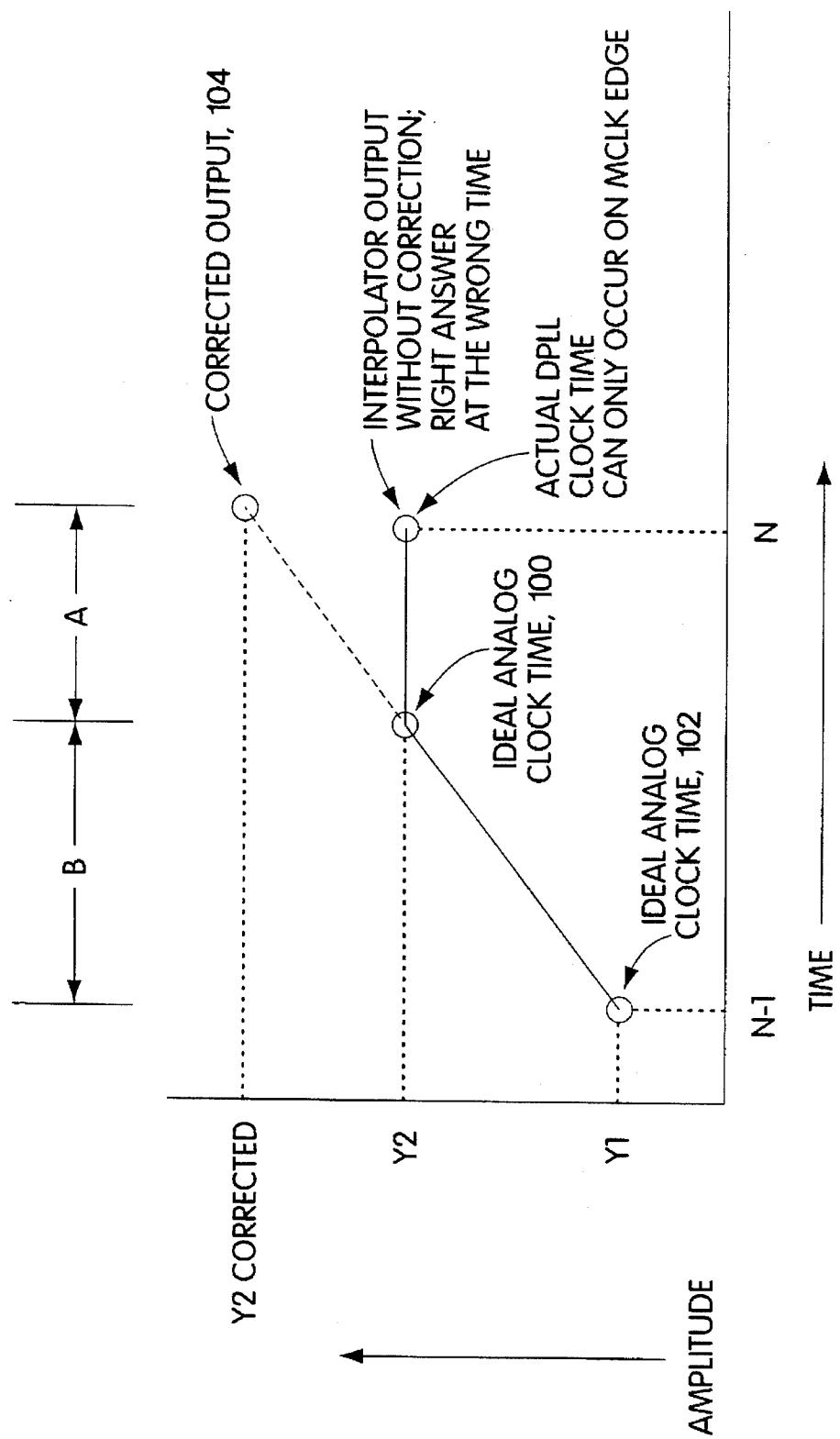
FIG. 8 is a diagram illustrating how the output of a digital interpolation filter is corrected using a residue signal from the digitally controlled oscillator.

FIG. 8 illustrates graphically how the distortion correction circuit works. The value Y1 is the output value produced by the interpolator at time N-1 corresponding to an ideal clock time indicated at 102. Y2 is the interpolator value at the current time N. Y2 was produced 'late' compared with where the ideal analog clock should have occurred at the time indicated at 100. The value of Y2 can be corrected by using the information contained in the digital VCO 'residue' signal, which is an accurate measure of the time difference between the ideal analog clock and the digital clock expressed as a fraction of the analog clock time period. Specifically, a new value of Y2 corresponding the actual digital PLL clock time as indicated at 104 can be generated by linear extrapolation according to the formula:

Y2_new=Y2+(Y2−Y1)*residue.

Figure 9:
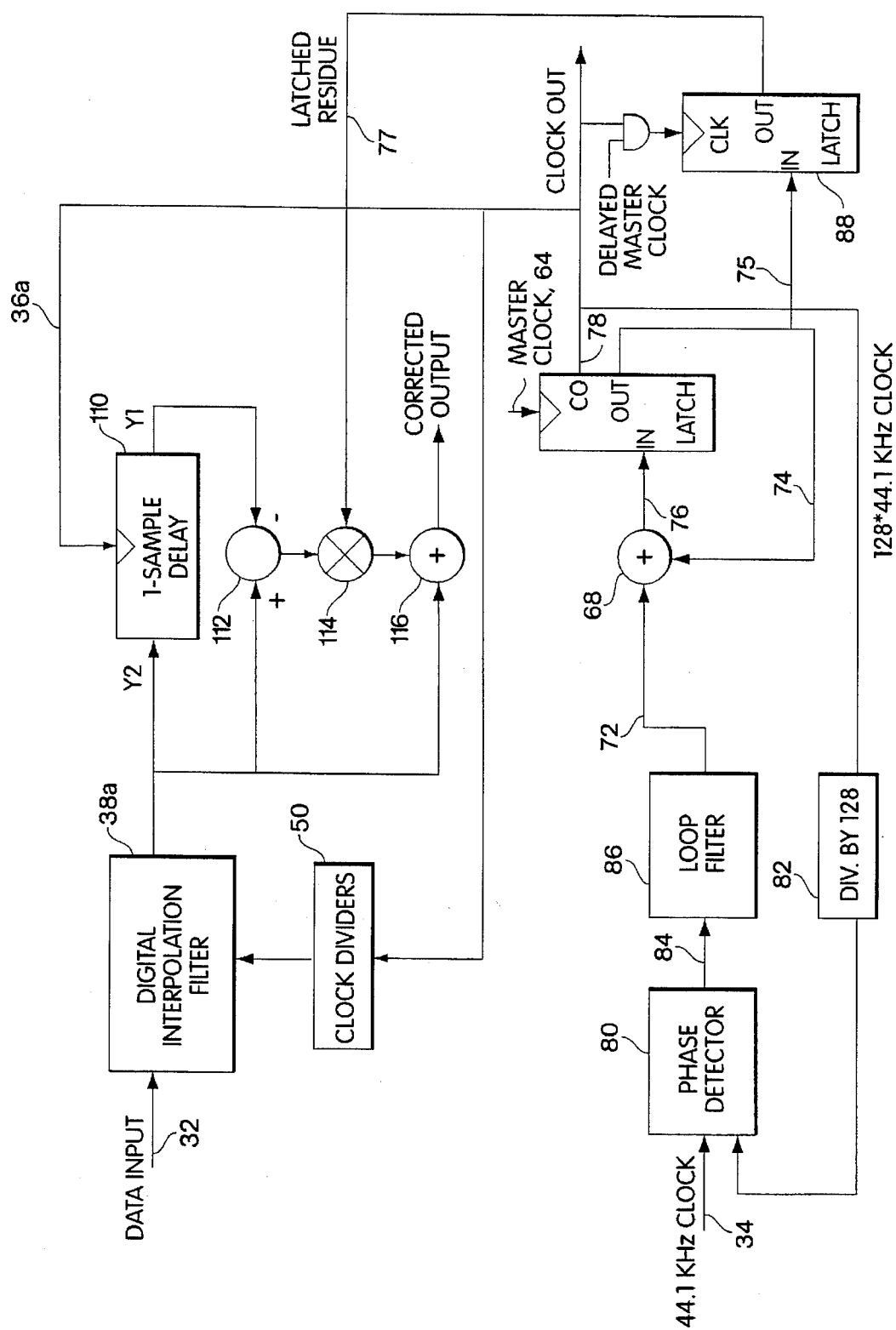
FIG. 9 is a block diagram of a digital interpolation filter using a correction circuit in accordance with the invention.

FIG. 9 illustrates an embodiment of a circuit for performing the correction described above. One subtraction, one addition and one multiplication are performed at the digital PLL-clock rate. Thus, Y2 is applied to a delay 110, having an output providing Y1. Y2 and Y1 are input to adder 112, which has an output connected to multiplier 114. Multiplier 114 has a second input which receives the residue signal 77 and then outputs the product of the residue signal and the difference between Y2 and Y1. An adder 116 has inputs receiving Y2 and the output of the multiplier 114 and produces their sum as the corrected output. The residue signal is latched when the digital PLL produces an output clock, so that subsequent master clock 64 pulses do not change its value. Note that the residue signal is repeated at the master clock rate during those master clock periods where the digital PLL clock 36a does not generate a new pulse.

It might at first glance appear that a better estimate of the signal could be obtained if the correction were delayed until the next cycle, as linear interpolation should in theory be more accurate than linear extrapolation. The problem with this method is that such a correction would be made assuming that the corrected data will be presented to the output at a time corresponding to the current digital PLL clock output. If the corrected data is not presented until one cycle later, the timing of the clock in terms of its lateness with respect to the ideal analog clock will be different, and therefore the correction would be no longer valid.

The difference between adjacent samples at the interpolator output is typically a small number. Usually, this number will be reduced in direct proportion to the interpolation ratio. For example, if the oversampling factor is $2^6$, then the differentiated signal will be 6 bits less than the input signal. Likewise, depending on the desired quality level, the number of bits required in the residue signal may be reduced by truncating the less significant bits. The reduction in the number of bits can reduce the size of the correction multiplier 114.

Figure 10:
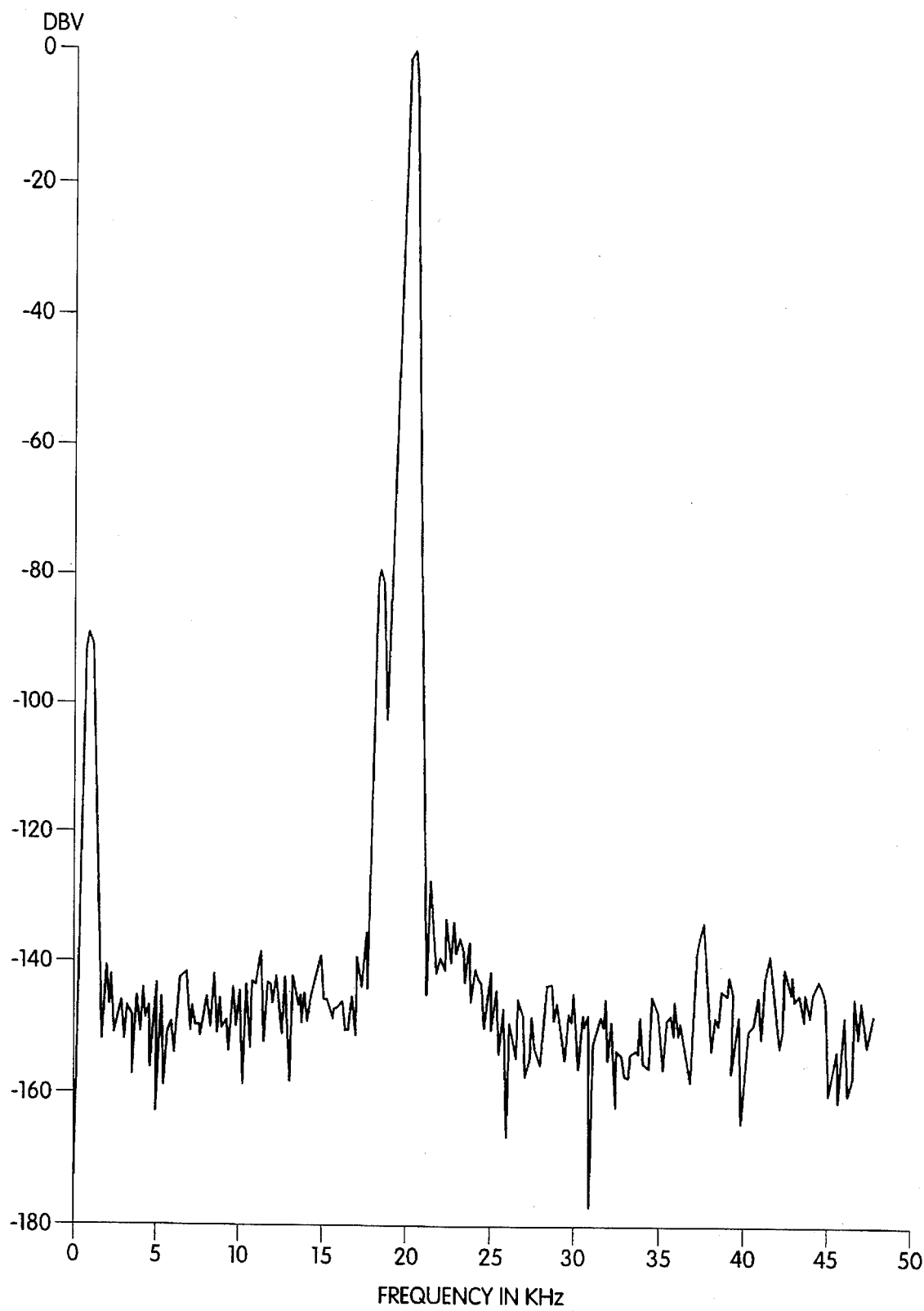
FIG. 10 is a graph illustrating a time-to-frequency domain transform of the output signal of a digital interpolation filter without correction.
Figure 11:
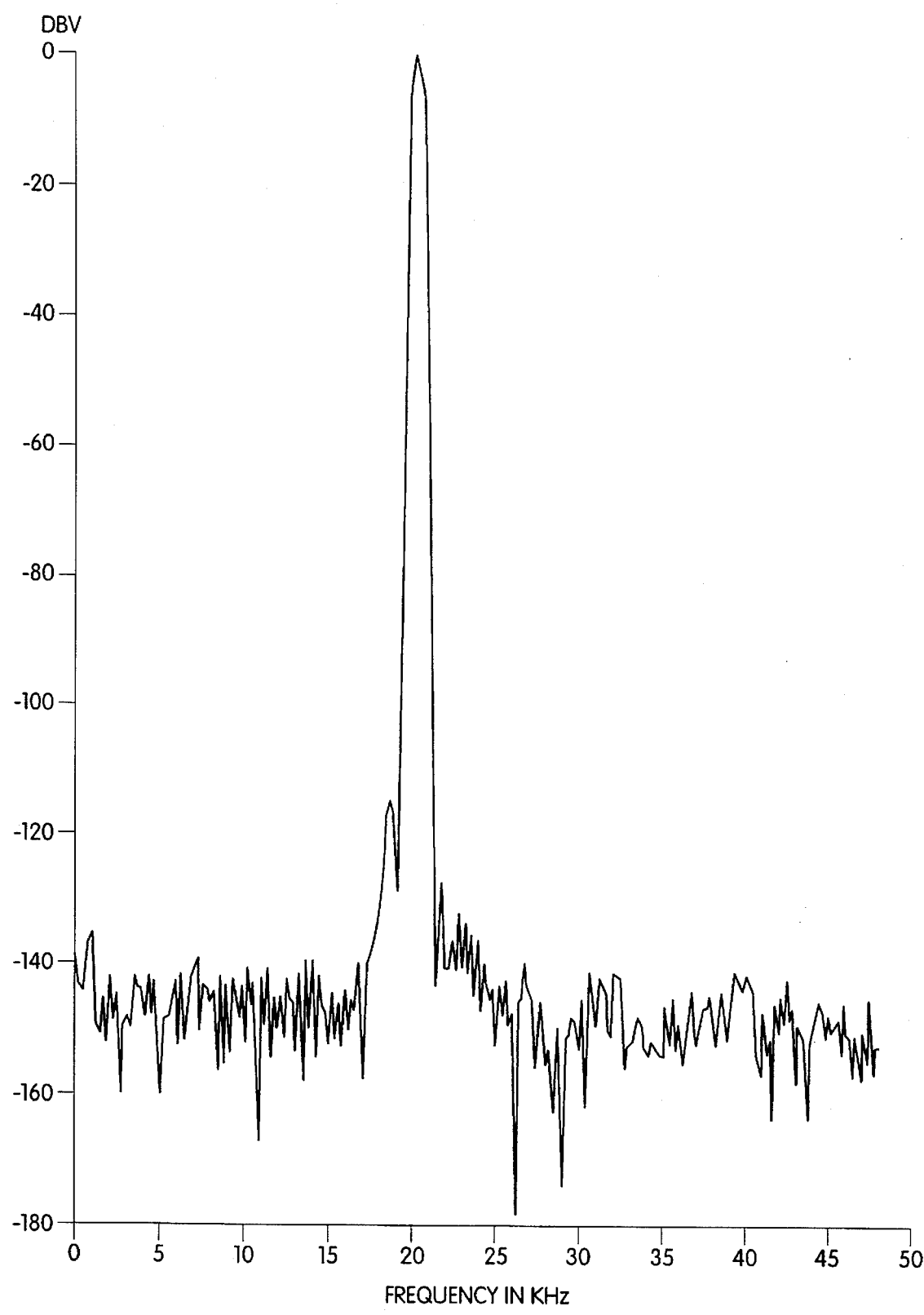
FIG. 11 is a graph of a time-to-frequency domain transform of the output of the digital interpolation filter with correction.

FIGS. 10 and 11 show fast fourier transform (FFT) plots of a digital PLL-driven interpolator with and without correction, for a master clock frequency of 12.288 MHZ and an interpolation factor of 64 applied to a 20 KHz sine wave input signal sampled at 44.1 KHz. The uncorrected FFT (FIG. 10) shows distortion as high as −80 dB relative to the fundamental amplitude. The corrected circuit (FIG. 11 ) shows that the distortion has been improved to better than −110 dB. These plots were generated for a worst-case input signal (highest-frequency, highest-amplitude).

Figure 12:
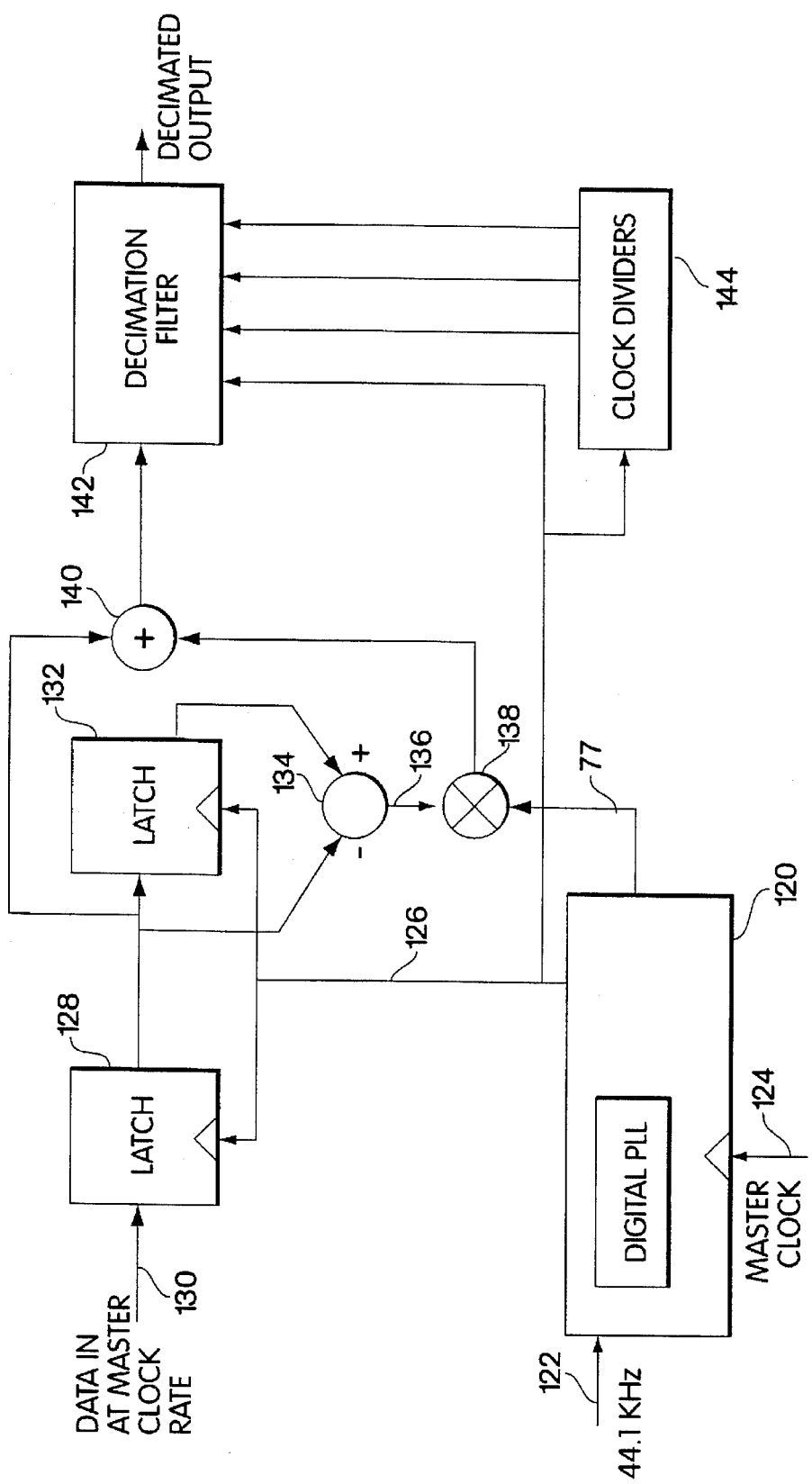
FIG. 12 is a block diagram of a continuously variable decimation filter in accordance with the invention.

This invention is also applicable to A/D converters using continuously variable decimation filters. FIG. 12 shows one circuit for continuously variable decimation. A digital PLL is locked to a clock signal 122 having a frequency which is a multiple of the output rate, e.g. 44.1 KHz. The digital PLL is driven by an asynchronous high-frequency master clock 124, just as in the case for interpolation. The input signal 30 is assumed to be at the full master clock rate. The digital PLL clock 126 is used to clock the input into a latch 128. The digital PLL clock 126 does not fire on every master clock cycle, resulting in a sub-sampling of the input data.

Next, the slope of the input signal is estimated by taking the difference between adjacent samples. A delay 132 and an adder 134 provide this difference at the output 136. This estimated slope is then multiplied by the latched residue signal 77 using multiplier 138. The product output by multiplier 138 is added to the current input sample using adder 140, just as in the case of interpolation. The formula describing the function of the correction circuit to provide the corrected value, Yn_corrected is:

$$Yn\_corrected = Yn + (Yn-1-Yn)*RESIDUE.$$

This corrected output is applied to decimation filter 142 which is controlled using signals derived by clock dividers 144. Note that the negative of the estimated slope is used in the formula above, due to a subtle difference between interpolation and decimation. In the case of interpolation, the amplitude of the data was altered so that when reproduced at a jittered time, the amplitude would be correct for that time. In the case of decimation, the decimation filter assumes that the numbers at its input come from a uniformly sampled signal. The actual time at which the numbers are available does not matter. The decimation filter simply takes a sequence of input numbers and performs some calculations on them to produce decimated output numbers. The goal of correction, then, is to produce input numbers that accurately represent samples of a clock signal with a uniform period.

Figure 13:
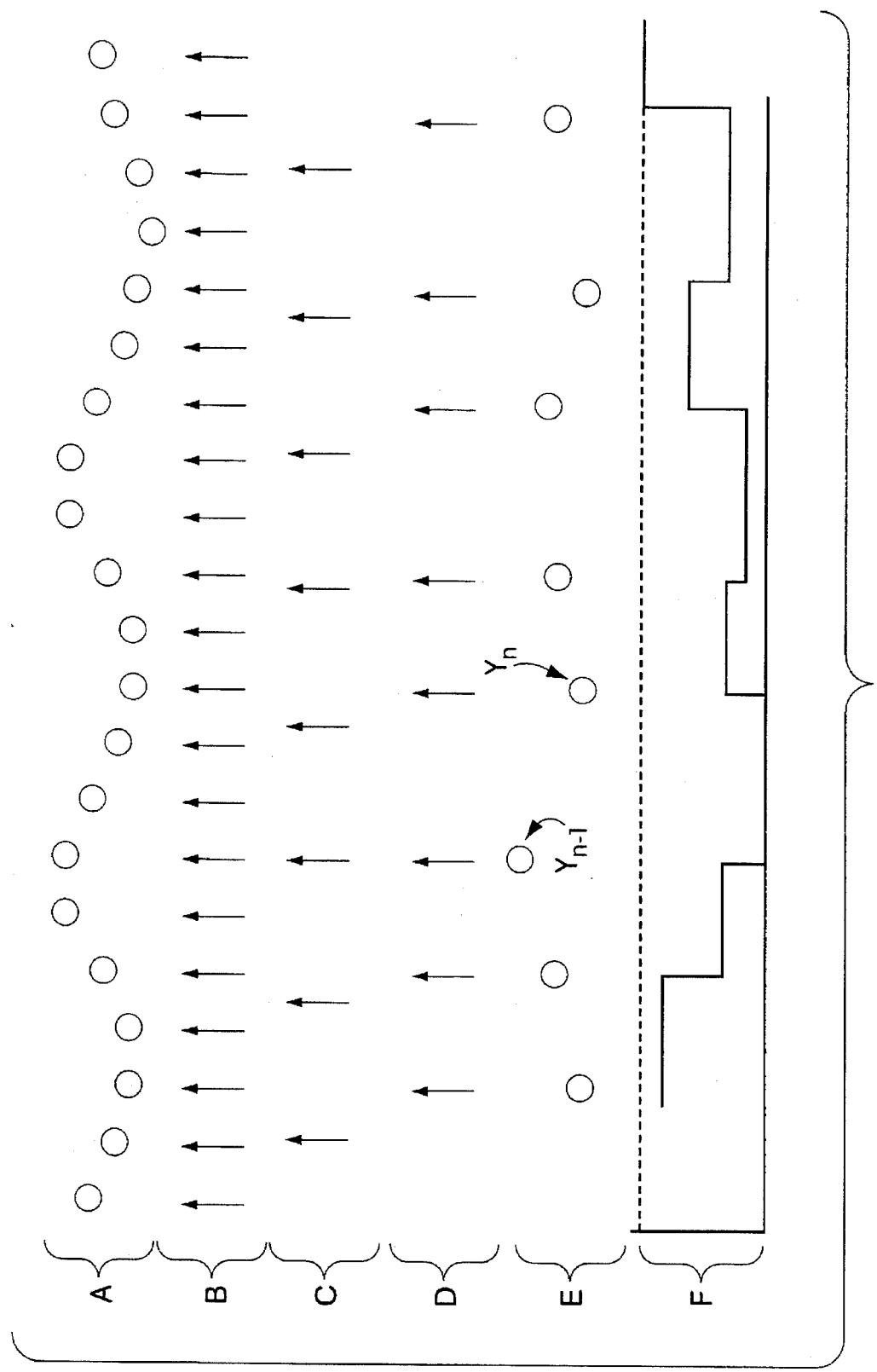
FIG. 13 is a timing diagram illustrating the output of a continuously variable decimation filter without correction.

Referring to FIG. 13 the residue signal 77 (shown at line F) indicates how late the digital PLL clocks pulses 126 are (shown at line D) compared with an imaginary uniform clock (shown at line C), where the clock frequency of this ideal clock is the same as the average clock frequency of the digital PLL clock. Lines A and B show the actual data (A) sampled at the master clock rate (B). The residue signal 77 is therefore used to backwards interpolate from the data clocked by the digital PLL (shown at line E) to the value that the data would have been at the ideal analog sampling time, using the data shown at line E that is clocked at the digital PLL clock rate shown at line D.

Figure 14:
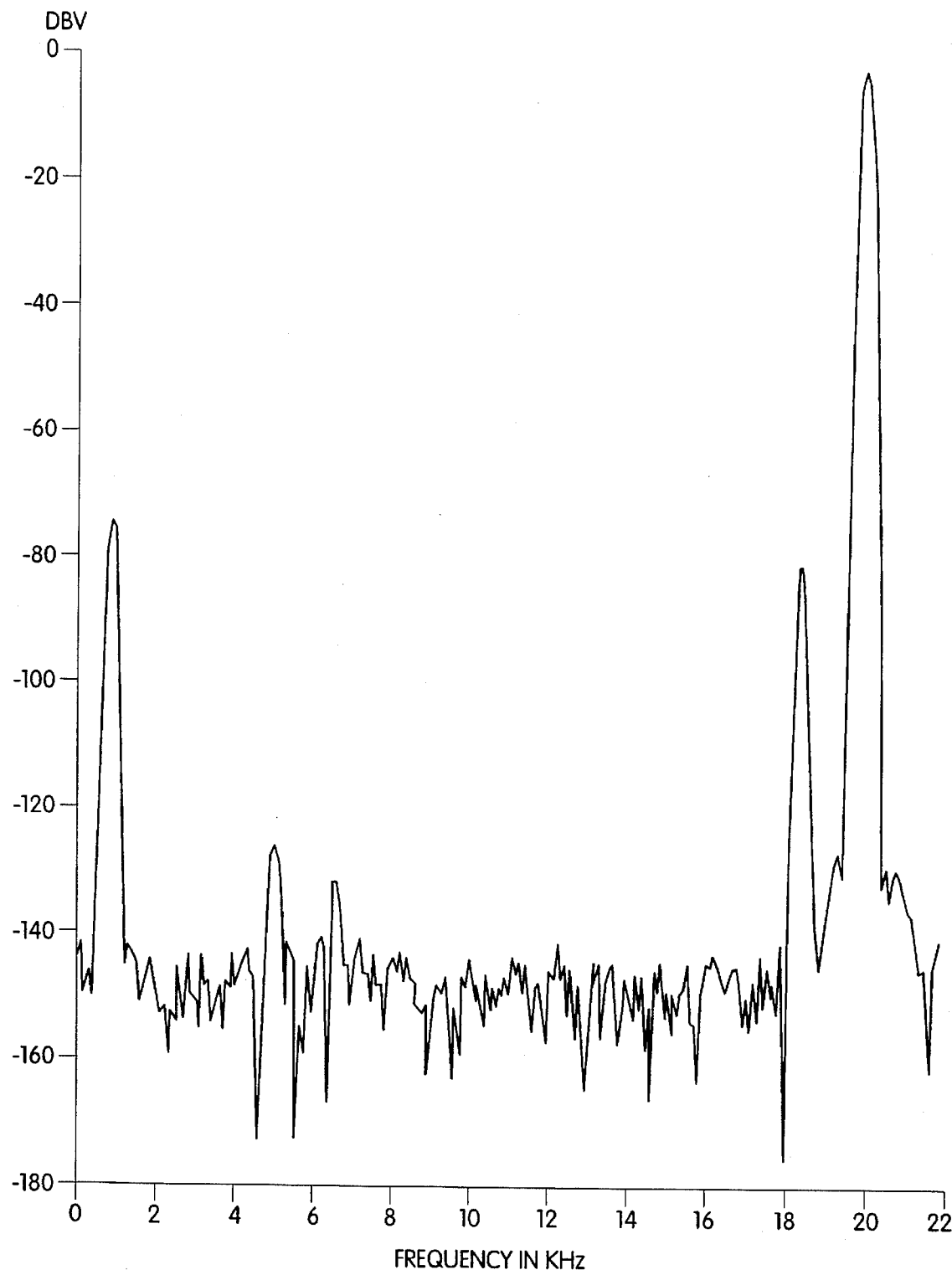
FIG. 14 is a graph of a time-to-frequency domain transform of the output of a decimation filter without correction.
Figure 15:
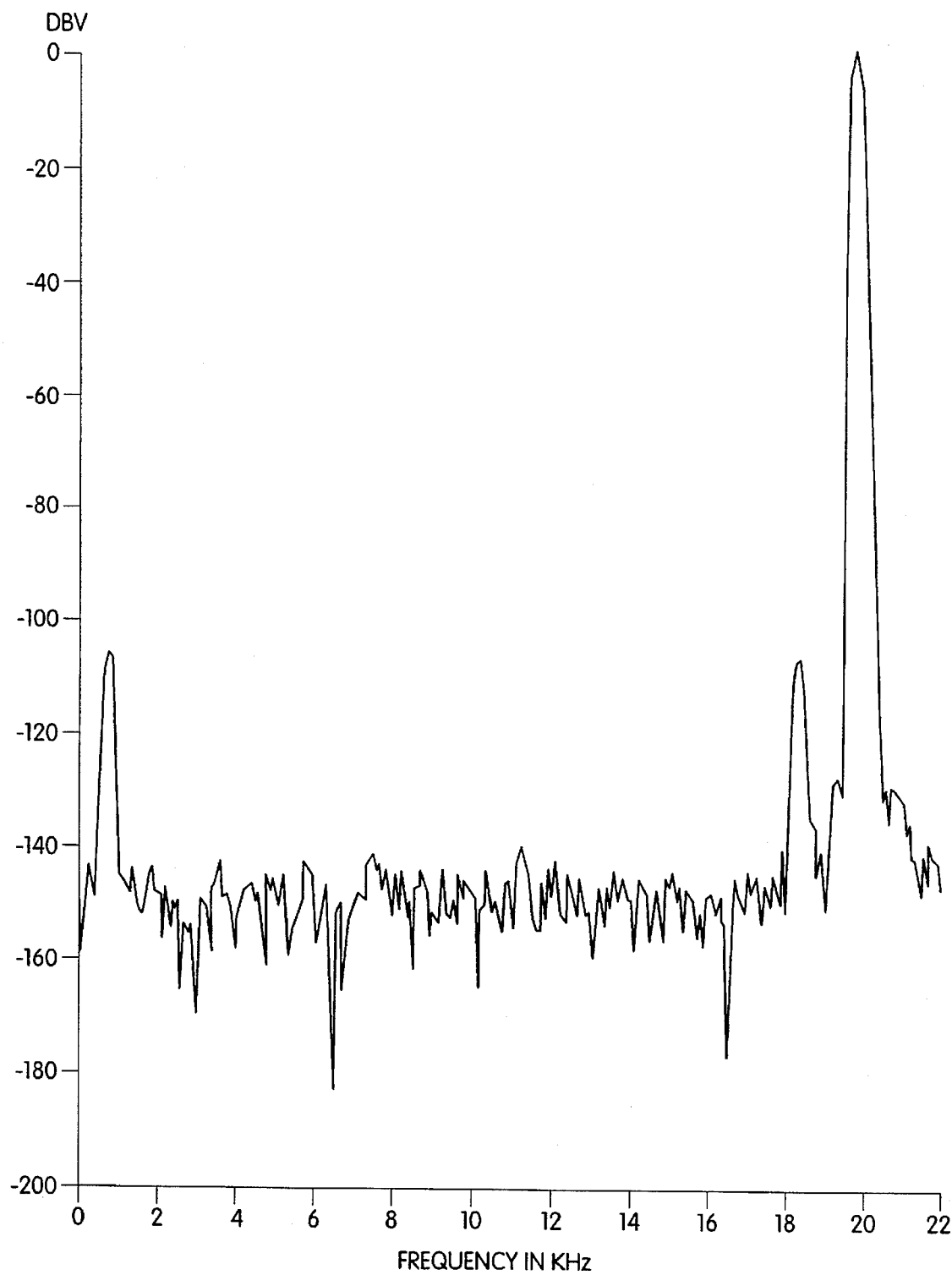
FIG. 15 is a graph of a time-to-frequency domain transform of the output of the decimation filter with corrections.

FIGS. 14 and 15 show the FFT of a decimated signal with and without the correction circuitry generated by computer simulation. Distortion is reduced from about −80 dB (in FIG. 14) to about −106 dB (in FIG. 15) with a worst-case (highest-frequency, highest-amplitude) signal, e.g. a 20 KHz sine wave sampled at 44.1 KHz, with a master clock of 6.144 MHz and a digital PLL average frequency of 64*44.4 KHz.

The fact that decimation does not work quite as well as interpolation can be explained as follows. The residue signal 77 used above is given by RESIDUE=A/B, where A is the time difference between DCO clock and ideal analog clock time, and B is the period of ideal analog clock.

The estimation of the signal slope is done using adjacent samples of the digital PLL-subsampled input data. Since the digital PLL clock is irregular, the slope of the input samples is estimated relative to the instantaneous time difference $\Delta t$ between the current digital PLL-sampled input and the previous digital PLL-sampled input. Therefore the estimated slope will be incorrect if it is assumed that the estimated slope was based on samples taken at the ideal analog clock times. However, the long-term average of these slope measurements will be correct, and therefore the performance of this correction circuit seems to be good even though its function is not analytically exact. The errors caused by this approximation are mostly at high frequencies, and tend to be removed by the filtering action of the decimation filter. Improved performance can be obtained by averaging or filtering the instantaneous slope estimates to obtain improved estimates.

Figure 16:
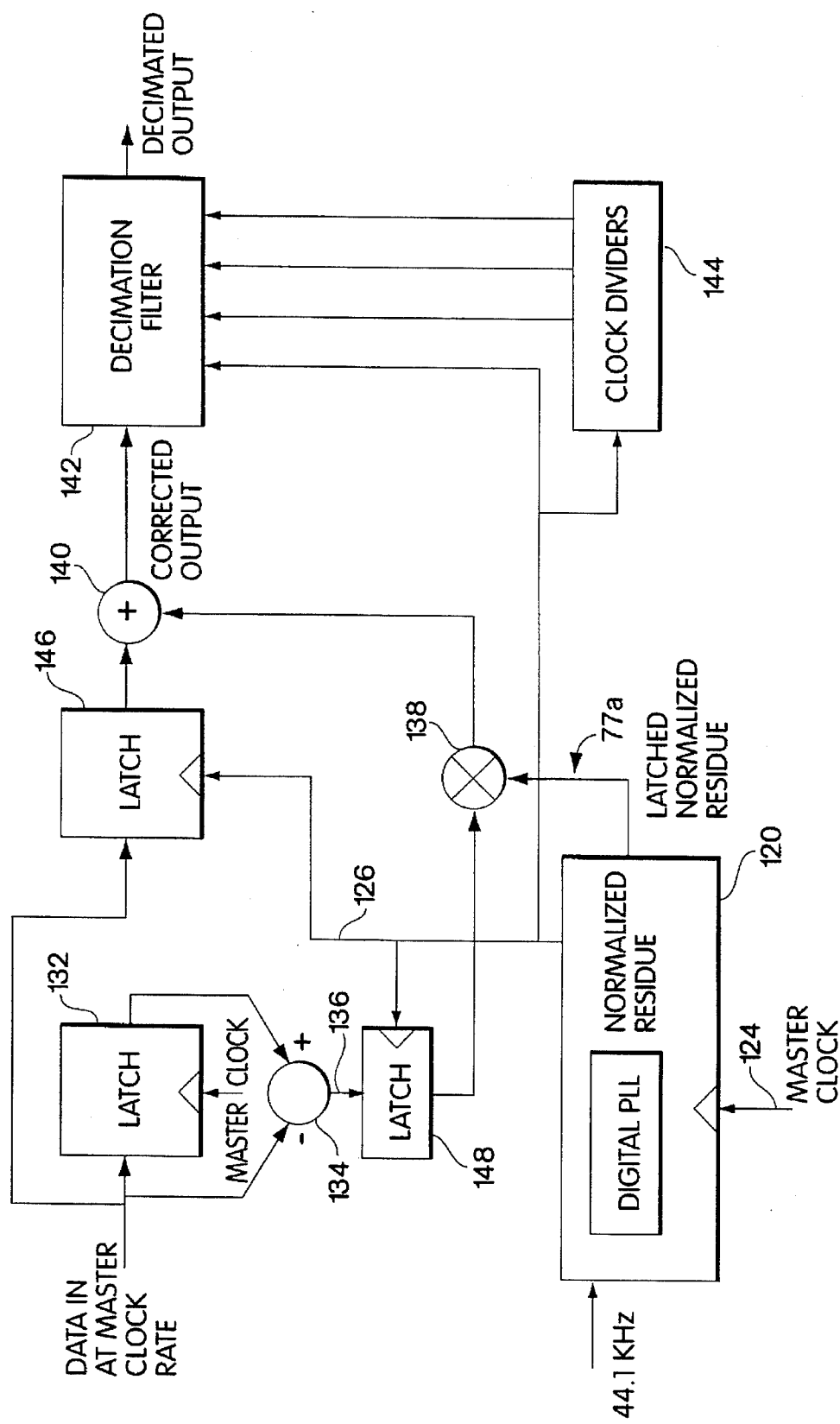
FIG. 16 is a block diagram of a continuously variable decimation filter using normalized residue.

FIG. 16 shows a more complex decimation filter with improved performance. It was noted earlier that an output may be made available from the DCO called a "normalized residue", where the residue signal 77 is divided by the frequency control number to produce the ratio A/C, where A is the time difference between ideal analog clock and digital PLL clock, and C is the master-clock period. By using this normalized residue signal, the master clock-sampled input can be directly manipulated and the correction factors are properly generated. The reason that using the normalized residue gives improved performance is that the slope signal is based on uniform samples at the master-clock rate and therefore does not have the error inherent in the circuit of FIG. 13. The drawback of this circuit is the requirement for a real-time divide operation to generate the normalized residue. Hence, FIG. 16 also includes additional latches 146 and 148 to provide for a delay in the correction circuit so as to compensate for the time used for division.

Figure 17:
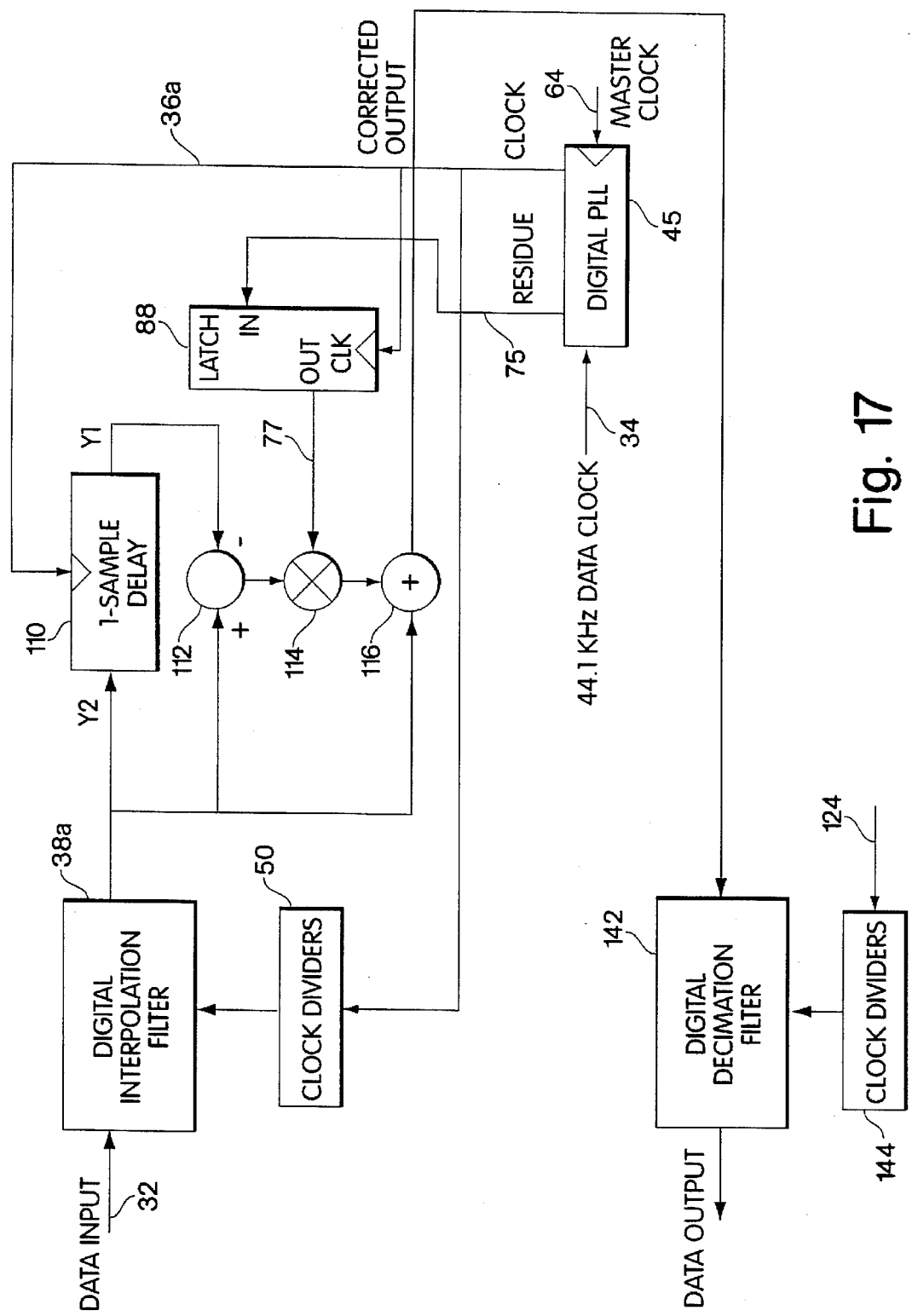
FIG. 17 is a block diagram of a sample rate converter using a digital interpolation filter in accordance with the invention.

The use of a decimation filter connected to the output of an interpolation filter allows this invention to be used as a sample-rate converter. For example, if the master clock signal is a trivial $2^N$ multiple of the desired output rate, then the master clock interpolated signal can be fed into a conventional decimator 142, as shown in FIG. 17. This decimation filter 142 receives data from the continuously variable interpolation filter, which changes at the rate of the digital PLL 45, to read the data at the master clock rate or some submultiple thereof as generated by clock dividers 144, which receive the master clock 124. There is no need for the decimation filter 142 to be "adaptive" in this case.

In the more general case where the master clock rate is not related to either the input or the output rate, decimation filter 142 is continuously variable, as described above in connection with FIGS. 13 and 16 and is connected to receive the output of the continuously variable interpolation filter shown in FIG. 9. In this embodiment, each of the filters has a phase-locked loop. The PLL for the interpolation filter is locked to the input sampling rate, whereas the PLL for the decimation filter is locked to the output sampling rate. Each PLL provides its own latched residue signal and its own corresponding correction circuit, as shown in FIGS. 9, 13 and 16.

Figure 18:
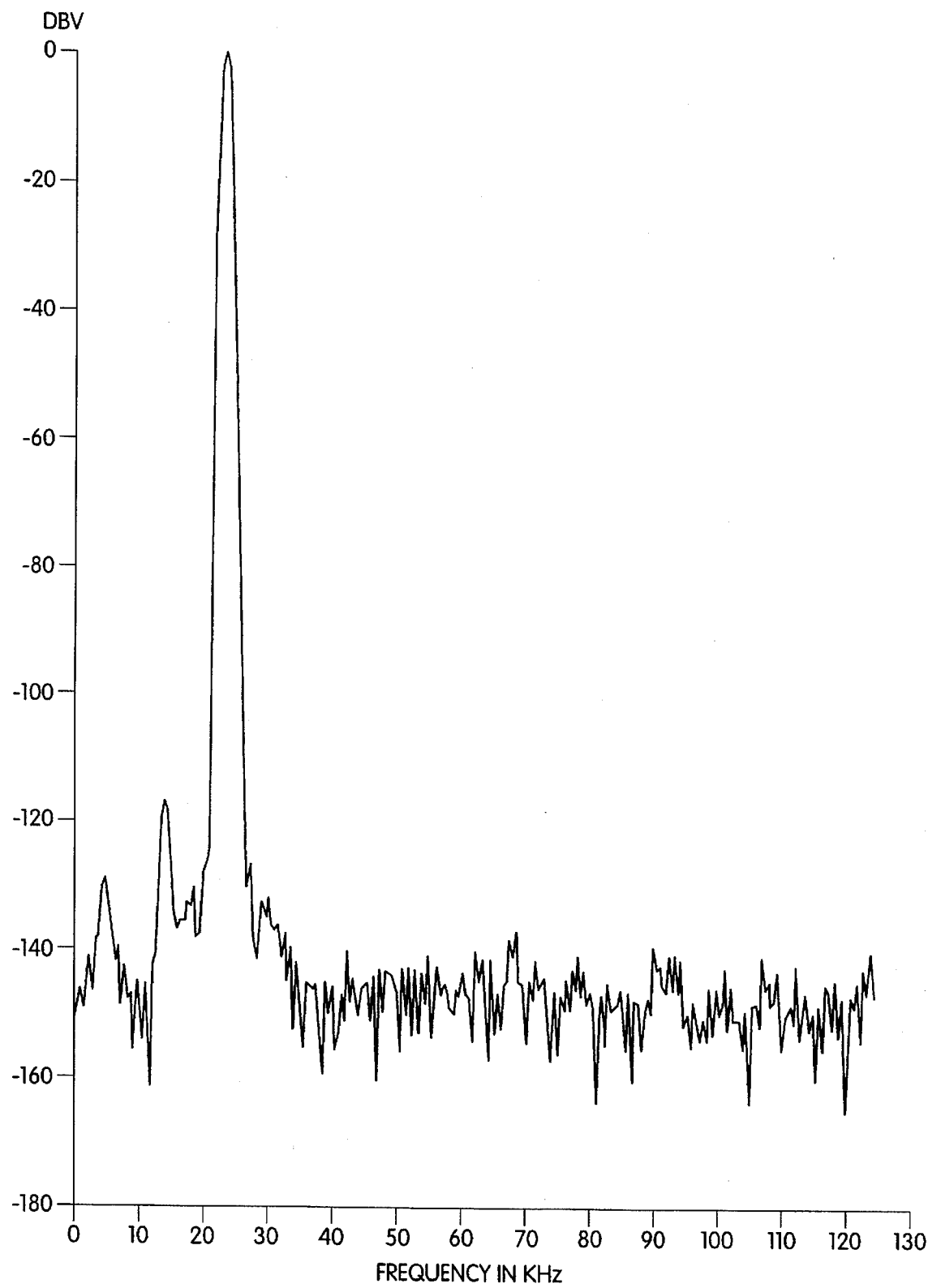
FIG. 18 is a graph illustrating a time-to-frequency domain transform of the output of a sample rate converter with correction.
Figure 19:
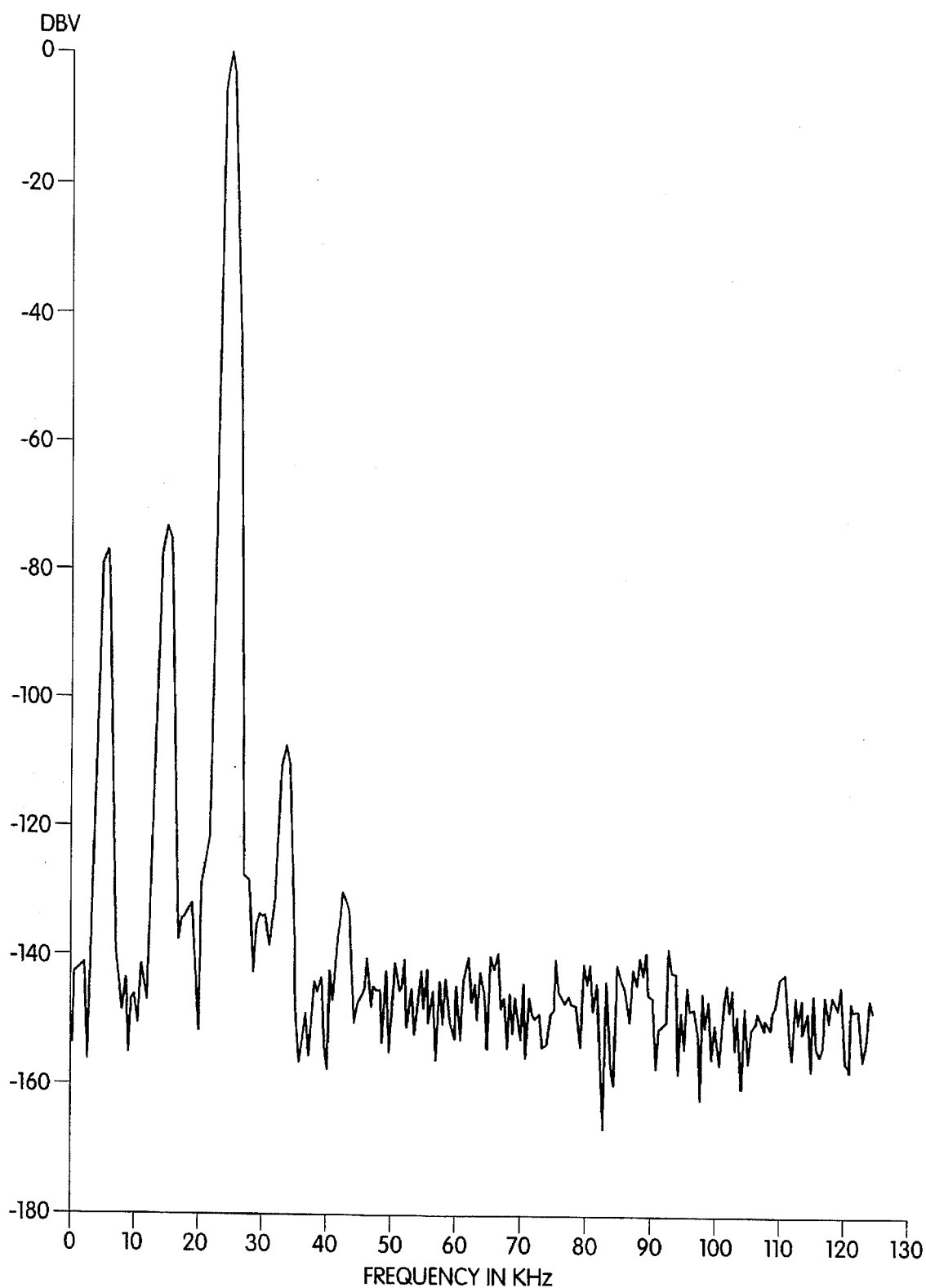
FIG. 19 is a graph illustrating a time-to-frequency domain transform of the output of a sample rate converter without correction.

FFT plots generated by computer simulation for the sample rate converter of FIG. 17 are shown with and without the correction circuit turned on in FIGS. 18 and 19, respectively. In both of these simulations, the asynchronous master clock was assumed to have a frequency of 27 MHz, whereas the PLL clock (for the interpolation filter) was assumed to have an average frequency of 6.136 MHz. Shown are the results of an input 20 Khz sine wave input.

As can be seen by the simulated outputs of corrected and uncorrected interpolation and decimation filters and sample rate converters, the invention provides a simple way to improve the signal to error ratio of these circuits.

Having now described a few embodiments of the invention, it should be apparent to those skilled in the art that the foregoing is merely illustrative and not limiting, having been presented by way of example only. Numerous modifications and other embodiments are within the scope of one of ordinary skill in the art. These and other modifications are contemplated as falling within the scope of the invention as defined by the appended claims.

What is claimed is:

1. A digitally controlled oscillator, comprising:
    a clock signal generator having a first input for receiving a frequency control signal, a second input for receiving a master clock signal and an output providing an output clock signal with clock pulses occurring at an average frequency proportional to the frequency control signal; and
    a time measuring circuit having an input connected to receive the output clock signal, and an output providing, for each clock pulse received from the output clock signal, a measure of a time period between an arrival time of a clock pulse of an imaginary ideal clock signal having a uniform period and a frequency equal to the average frequency of the output clock signal and an arrival time of the clock pulse received from the output clock signal.

2. The digitally controlled oscillator of claim 1, wherein the clock signal generator comprises a modulo accumulator having an input receiving the frequency control signal and an output which increments according to the frequency control signal and according to the master clock signal, and which periodically wraps when the output of the modulo accumulator exceeds a threshold to generate the output clock signal at the output of the clock signal generator; and wherein the time measuring circuit comprises a latch that samples lower bits of the output of the modulo accumulator when the modulo accumulator wraps as indicated by the output clock signal and before any subsequent pulse of the master clock signal to provide an output indicative of the measure of the time period.

3. The digitally controlled oscillator of claim 2, wherein the modulo accumulator comprises:
    an adder having an input connected to receive the frequency control signal and a second input and an output providing the sum of the first and second inputs; and
    a first latch having an input connected to the output of the adder and an output connected to the second input of the adder and which latches the output of the adder on pulses of the master clock signal, wherein a most significant bit of the output of the latch provides the output clock signal.

4. The digitally controlled oscillator of claim 3, further comprising:
    a second latch connected to receive the frequency control signal and which latches according to a delayed master clock signal; and
    a divider having a first input connected to the output of the time measuring circuit and a second input connected to the output of the second latch and an output providing a quotient of the first input to the second input.

5. The digitally controlled oscillator of claim 2, further comprising:
    a divider having a first input connected to receive the frequency control signal and a second input connected to receive the output of the latch and an output providing a quotient of the first input to the second input.

6. The digitally controlled oscillator of claim 1, further comprising:
    a divider having a first input connected to receive the frequency control signal and a second input connected to receive the measure of the time period and an output providing a quotient of the first input to the second input.

7. The digitally controlled oscillator of claim 1 embodied in a digital phase-locked loop.

8. A digitally controlled oscillator, comprising:
    a modulo accumulator having a first input for receiving a frequency control signal and a second input for receiving a master clock signal, and an output which increments according to the frequency control signal and according to the master clock signal, and which periodically wraps when the output exceeds a threshold to generate an output clock signal with pulses occurring at an average frequency proportional to the frequency control signal; and
    a first latch having an input connected to receive lower bits of the output of the modulo accumulator and a latch input connected to receive the output clock signal, and an output which provides a sample of lower bits of the output of the modulo accumulator when the modulo accumulator wraps and before any subsequent pulse of the master clock signal to provide a measure of time between an arrival time of a clock pulse of an imaginary ideal clock signal having a uniform period and a frequency equal to the average frequency of the output clock signal and an arrival time of a clock pulse in the output clock signal.

9. The digitally controlled oscillator of claim 8, wherein the modulo accumulator comprises:
    an adder having an input connected to receive the frequency control signal and a second input and an output providing the sum of the first and second inputs; and a second latch having an input connected to the output of the adder and an output connected to the second input of the adder and which latches the output of the adder on pulses of the master clock signal, wherein a most significant bit of the output of the second latch provides the output clock signal.

10. The digitally controlled oscillator of claim 9, further comprising:

a third latch connected to receive the frequency control signal and which latches according to a delayed master clock signal; and a divider having a first input connected to the output of the first latch and a second input connected to the output of the third latch and an output providing a quotient of the first input to the second input.

11. The digitally controlled oscillator of claim 8, further comprising:

a divider having a first input connected to receive the frequency control signal and a second input connected to receive the measured time period and an output providing a quotient of the first input to the second input.

12. The digitally controlled oscillator of claim 8, embodied in a digital phase-locked loop for generating an output clock signal having an average frequency substantially higher than an input clock signal, comprising:

a phase detector having a first input connected to receive the input clock signal and a second input connected to receive the output clock signal from the digitally controlled oscillator and an output providing a signal indicative of a measure of a difference in phase of the first and second inputs; and a loop filter connected to receive the output of the phase detector and having an output providing the frequency control signal to the digitally controlled oscillator.

13. The digitally controlled oscillator of claim 12, wherein the digital phase-locked loop is embodied in a digital interpolation filter for interpolating input data received at a rate defined by the input clock signal to generate an output filtered signal at a rate defined by the output clock signal, comprising:

an interpolator having a first input for receiving the output clock signal of the digitally controlled oscillator and a second input for receiving the input data and an output providing a signal indicative of interpolated input data, at time intervals according to the output clock signal; and a correction circuit having an input connected to receive a first interpolated output from a first time and a second interpolated output from a second time and a second input connected to receive the measure of the time period from the digitally controlled oscillator and an output providing the output filtered signal indicative of a result of a corrective function applied to the first and second interpolated outputs according to the measure of the time period.

14. The digitally controlled oscillator of claim 13, wherein the corrective function is an extrapolation function and the output filtered signal is the sum of the second interpolated output and the product of the measure of the time period and the difference between the second interpolated output and the first interpolated output.

15. The digitally controlled oscillator of claim 13 embodied in a circuit for converting the input data to an analog signal, comprising:

a noise shaper, having an input connected to receive the output of the digital interpolation filter at a rate defined by the output clock signal of the digitally controlled oscillator, and an output which provides a noise-shaped signal;

a digital-to-analog converter, having an input connected to receive the output of the noise-shaper and an output providing the analog signal according to the noise-shaped signal.

16. The digitally controlled oscillator of claim 12, embodied in a digital decimation filter for decimating input data received at a rate defined by the master clock signal to provide an output decimated signal at a rate related to the phase-locked output clock signal, comprising:

a correction circuit which receives the input data according to the master clock signal and generates a corrected output from the input data for each clock pulse of the phase-locked output clock signal; and a decimator having an input connected to receive the corrected output from the correction circuit at a rate related to the phase-locked output clock signal and an output providing the output decimated signal.

17. The digitally controlled oscillator of claim 16, wherein the correction circuit performs backward interpolation according to the measure of the time period and two adjacent input values.

18. The digitally controlled oscillator of claim 17, further comprising means for normalizing the measure of the time period wherein the measure of the time period used by the correction circuit is the normalized measure of the time period.

19. The digitally controlled oscillator of claim 13, embodied in a sample rate converter for converting the input data to a sequence of output samples at an output sampling rate, comprising:

a decimation filter having an input for receiving the output filtered signal and an output providing a decimated output filtered signal at a rate according to the output sampling rate.

20. A process for generating a digitally controlled output clock signal having an average frequency defined by a frequency control signal, and a measure of a time period between pulses of the output clock signal and an imaginary ideal clock signal having a uniform period and a frequency equal to the average frequency of the output clock signal, comprising the steps of:

generating a periodically overflowing ramp signal, having a most significant bit providing the output clock signal, and lower bits using an accumulator having an input connected to receive the frequency control signal and an output providing a signal indicative of an accumulation of the frequency control signal in response to pulses of a master clock signal; and sampling the lower bits of the output of the accumulator in response to a transition in the most significant bit of the accumulator and before a subsequent pulse of the master clock signal occurs.

21. The process of claim 20, wherein the step of generating comprises the steps of:

accumulating the frequency control signal and a sum for each pulse of the master clock signal; and sampling the accumulated frequency control signal for each pulse of the master clock signal to provide the sum, wherein a most significant bit of the sum provides the output clock signal.

22. The process of claim 21, further comprising the step of dividing the measure of the time period by the frequency control signal to provide a normalized residue signal.

23. The process of claim 20, further comprising the step of dividing the measure of the time period by the frequency control signal to provide a normalized residue signal.

24. The process of claim 20, used in a process for making the output clock signal phase-locked to and having an average frequency substantially higher than an input clock signal, comprising the steps of:

determining a phase difference between the input clock signal and the output clock signal; and filtering the phase difference to provide the frequency control signal used in the step of generating to phase lock the output clock signal to the input clock signal.

25. The process of claim 24, used in a process for interpolating input data received at a rate defined by the input clock signal to generate an output filtered signal at a rate defined by the phase-locked output clock signal, comprising the steps of:

oversampling the input data at a rate defined by the phase-locked output clock signal to provide a sample for each pulse of the phase-locked output clock signal; and correcting each sample of the oversampled input signal according to the measure of the time period of the associated pulse of the phase-locked output clock signal to provide the output filtered signal.

26. The process of claim 25, wherein the step of correcting includes the step of extrapolating the oversampled input signal using at least two adjacent outputs of the output filtered signal for each sample and the measure of the time period associated with the sample.

27. The process of claim 25, used in a process for converting the input data to an analog signal, comprising:

noise-shaping the output filtered signal; and converting the noise-shaped signal into the analog signal.

28. The process of claim 24, used in a process for decimating input data received at a rate defined by the master clock signal, wherein the master clock signal is the input clock signal to the step of determining a phase difference, to provide an output decimated signal at a rate related to the phase-locked output clock signal, comprising:

correcting each value of the input data using the measure of the time period for each pulse of the phase-locked clock signal to provide corrected data with values corresponding to sample times of the phase-locked output clock signal; and decimating the corrected signal using a decimation filter by reading each corrected value of the input data at a rate related to the frequency of the phase-locked output clock signal.

29. The process of claim 28, wherein the step of correcting includes performing backwards interpolation of at least two sequential values of the input data and the measure of the time period.

30. The process of claim 29, wherein the step of correcting comprises a step of normalizing the measure of the time period.

31. The process of claim 25, used in a process for converting the input data to a sequence of output samples having an output sampling rate, comprising the step of decimating the output filtered signal at the output sampling rate.

* * * * *